United States Patent
Yuan et al.

(10) Patent No.: US 11,190,136 B2
(45) Date of Patent: Nov. 30, 2021

(54) AMPLIFICATION SYSTEMS AND METHODS WITH ONE OR MORE CHANNELS

(71) Applicant: ON-BRIGHT ELECTRONICS (SHANGHAI) CO., LTD., Shanghai (CN)

(72) Inventors: Tingzhi Yuan, Shanghai (CN); Yaozhang Chen, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 92 days.

(21) Appl. No.: 16/431,014

(22) Filed: Jun. 4, 2019

(65) Prior Publication Data

US 2019/0348951 A1 Nov. 14, 2019

Related U.S. Application Data

(63) Continuation of application No. 15/140,367, filed on Apr. 27, 2016, now Pat. No. 10,355,644, which is a (Continued)

(30) Foreign Application Priority Data

Aug. 21, 2013 (CN) .......................... 201310368267.1

(51) Int. Cl.
*H03F 1/02* (2006.01)
*H03F 3/217* (2006.01)
(Continued)

(52) U.S. Cl.
CPC ........... *H03F 1/0205* (2013.01); *H03F 3/185* (2013.01); *H03F 3/217* (2013.01); *H03F 3/2171* (2013.01);
(Continued)

(58) Field of Classification Search
CPC .................................................... H03F 1/0205
See application file for complete search history.

(56) References Cited

U.S. PATENT DOCUMENTS

| 3,420,954 A | 1/1969 | Bach |
| 3,632,886 A | 1/1972 | Scheiber |

(Continued)

FOREIGN PATENT DOCUMENTS

| CN | 1960172 A | 5/2007 |
| CN | 1992520 A | 7/2007 |

(Continued)

OTHER PUBLICATIONS

Cai et al., "The Design of Class D Audio Power Amplifier with PWM Modulation," *Advanced Display*, 127, Aug. 2011, pp. 25-30.

(Continued)

*Primary Examiner* — Patricia T Nguyen
(74) *Attorney, Agent, or Firm* — Faegre Drinker Biddle & Reath LLP

(57) ABSTRACT

Systems and methods are provided for amplifying multiple input signals to generate multiple output signals. An example system includes a first channel, a second channel, and a third channel. The first channel is configured to receive one or more first input signals, process information associated with the one or more first input signals and a first ramp signal, and generate one or more first output signals. The second channel is configured to receive one or more second input signals, process information associated with the one or more second input signals and a second ramp signal, and generate one or more second output signals. The first ramp signal corresponds to a first phase. The second ramp signal corresponds to a second phase. The first phase and the second phase are different.

2 Claims, 17 Drawing Sheets

Related U.S. Application Data continuation of application No. 14/504,229, filed on Oct. 1, 2014, now Pat. No. 9,369,096, which is a continuation of application No. 14/014,177, filed on Aug. 29, 2013, now Pat. No. 9,054,644.

(51) Int. Cl.
  *H03F 3/45* (2006.01)
  *H03F 3/185* (2006.01)
  *H03F 3/68* (2006.01)

(52) U.S. Cl.
  CPC ......... *H03F 3/2173* (2013.01); *H03F 3/2175* (2013.01); *H03F 3/45071* (2013.01); *H03F 3/45475* (2013.01); *H03F 3/68* (2013.01); *H03F 2200/03* (2013.01); *H03F 2200/171* (2013.01); *H03F 2200/351* (2013.01); *H03F 2200/78* (2013.01); *H03F 2203/21106* (2013.01); *H03F 2203/21145* (2013.01); *H03F 2203/21157* (2013.01)

(56) References Cited

U.S. PATENT DOCUMENTS

| | | | |
|---|---|---|---|
| 3,671,836 A * | 6/1972 | Kolatorowicz | H02P 7/293 388/830 |
| 4,204,173 A | 5/1980 | Aschwanden | |
| 4,227,186 A | 10/1980 | Aschwanden | |
| 4,293,821 A | 10/1981 | Boudouris et al. | |
| 4,415,863 A | 11/1983 | Tokumo | |
| 4,599,579 A | 7/1986 | McCann | |
| 4,862,272 A * | 8/1989 | Karlock | H04N 5/265 348/584 |
| 4,890,248 A | 12/1989 | Reinhardt | |
| 5,363,055 A | 11/1994 | Ribner | |
| 5,659,587 A | 8/1997 | Knierim | |
| 5,708,687 A | 1/1998 | Powell et al. | |
| 5,955,910 A | 9/1999 | Levin et al. | |
| 6,016,075 A | 1/2000 | Hamo | |
| 6,069,804 A | 5/2000 | Ingman et al. | |
| 6,169,440 B1 | 1/2001 | Liu | |
| 6,201,417 B1 | 3/2001 | Blum et al. | |
| 6,229,389 B1 | 5/2001 | Pullen et al. | |
| 6,452,443 B1 | 9/2002 | Thompson et al. | |
| 6,975,665 B1 | 12/2005 | McCorkle | |
| 6,998,850 B2 | 2/2006 | Baumgartner | |
| 7,010,131 B1 | 3/2006 | Rhode et al. | |
| 7,038,535 B2 | 5/2006 | Lee | |
| 7,061,213 B2 | 6/2006 | Yoshida | |
| 7,068,095 B2 | 6/2006 | Bernardon | |
| 7,075,353 B1 | 7/2006 | Wan et al. | |
| 7,076,070 B2 | 7/2006 | Pearce et al. | |
| 7,091,795 B1 | 8/2006 | Tsyrganovich | |
| 7,119,612 B1 | 10/2006 | Holloway et al. | |
| 7,221,216 B2 | 5/2007 | Nguyen | |
| 7,250,813 B1 | 7/2007 | Yao | |
| 7,279,970 B2 | 10/2007 | Yokoyama et al. | |
| 7,345,533 B2 | 3/2008 | Lee | |
| 7,345,540 B2 | 3/2008 | Chang et al. | |
| 7,378,904 B2 | 5/2008 | Risbo | |
| 7,400,191 B2 | 7/2008 | Rodriguez | |
| 7,417,497 B2 | 8/2008 | Lee | |
| 7,492,219 B1 | 2/2009 | Cyrusian | |
| 7,705,672 B1 | 4/2010 | Rodriguez | |
| 7,768,801 B2 | 8/2010 | Usui et al. | |
| 7,852,156 B1 | 12/2010 | Chen et al. | |
| 7,889,875 B2 | 2/2011 | Hu et al. | |
| 7,893,768 B2 | 2/2011 | Wang et al. | |
| 7,944,192 B2 | 5/2011 | Moussaoui et al. | |
| 7,952,894 B2 | 5/2011 | Lin et al. | |
| 8,022,756 B2 | 9/2011 | Walker et al. | |
| 8,319,570 B2 | 11/2012 | Wilson | |
| 8,351,880 B1 | 1/2013 | Hietala et al. | |
| 8,471,628 B2 | 6/2013 | Ryat | |
| 8,558,609 B2 | 10/2013 | Fang et al. | |
| 8,855,335 B2 | 10/2014 | Henriksen | |
| 8,975,957 B1 | 3/2015 | Yuan et al. | |
| 8,981,832 B2 | 3/2015 | Yuan et al. | |
| 9,054,644 B2 | 6/2015 | Yuan et al. | |
| 9,065,401 B2 | 6/2015 | Fang et al. | |
| 9,331,567 B2 | 5/2016 | Lin et al. | |
| 9,369,096 B2 | 6/2016 | Yuan et al. | |
| 9,685,919 B2 | 6/2017 | Yuan et al. | |
| 9,716,469 B2 | 7/2017 | Yuan et al. | |
| 10,355,644 B2 | 7/2019 | Yuan et al. | |
| 10,505,507 B2 | 12/2019 | Yuan et al. | |
| 10,749,479 B2 | 8/2020 | Yuan et al. | |
| 10,951,186 B2 | 3/2021 | Yuan et al. | |
| 2003/0201761 A1 * | 10/2003 | Harris | H02J 1/102 323/272 |
| 2005/0017799 A1 | 1/2005 | Risbo et al. | |
| 2006/0008095 A1 | 1/2006 | Tsuji | |
| 2006/0044059 A1 | 3/2006 | Yokoyama et al. | |
| 2006/0158246 A1 | 7/2006 | Lee | |
| 2006/0158247 A1 | 7/2006 | Lee | |
| 2007/0040608 A1 | 2/2007 | Magrath et al. | |
| 2007/0146069 A1 * | 6/2007 | Wu | H03F 3/2173 330/251 |
| 2007/0258272 A1 | 11/2007 | Brown | |
| 2008/0284508 A1 | 11/2008 | Walker et al. | |
| 2009/0009254 A1 | 1/2009 | Segarra | |
| 2009/0072805 A1 | 3/2009 | Yamada | |
| 2009/0135694 A1 | 5/2009 | Wang | |
| 2009/0160547 A1 * | 6/2009 | Shankar | H03F 3/217 330/10 |
| 2009/0160551 A1 | 6/2009 | Chen et al. | |
| 2009/0322300 A1 | 12/2009 | Melanson et al. | |
| 2010/0001799 A1 | 1/2010 | Llewellyn | |
| 2010/0007387 A1 | 1/2010 | Chang | |
| 2010/0007413 A1 | 1/2010 | Herleikson | |
| 2010/0045350 A1 | 2/2010 | Saito et al. | |
| 2010/0045356 A1 | 2/2010 | Berkhout et al. | |
| 2010/0102672 A1 * | 4/2010 | Hoffman | B06B 1/0253 310/317 |
| 2010/0207691 A1 | 8/2010 | Kim | |
| 2010/0253427 A1 | 10/2010 | Chen et al. | |
| 2010/0272294 A1 | 10/2010 | Arknaes-Pedersen et al. | |
| 2010/0327836 A1 | 12/2010 | Li et al. | |
| 2011/0026739 A1 | 2/2011 | Thomsen et al. | |
| 2011/0193634 A1 | 8/2011 | Ryat | |
| 2012/0182081 A1 | 7/2012 | Tsuchiya et al. | |
| 2012/0299660 A1 | 11/2012 | Arkiszewski et al. | |
| 2012/0321279 A1 | 12/2012 | Quan | |
| 2013/0027149 A1 | 1/2013 | Marinas et al. | |
| 2013/0057331 A1 | 3/2013 | Yuan et al. | |
| 2013/0100715 A1 | 4/2013 | Lin et al. | |
| 2013/0300464 A1 | 11/2013 | Kleinpenning et al. | |
| 2014/0003631 A1 | 1/2014 | Fang et al. | |
| 2014/0197828 A1 | 7/2014 | Kagano et al. | |
| 2014/0254837 A1 | 9/2014 | Mortensen et al. | |
| 2015/0008790 A1 * | 1/2015 | Brubaker | B06B 1/0261 310/316.01 |
| 2015/0054577 A1 | 2/2015 | Yuan et al. | |
| 2015/0054578 A1 | 2/2015 | Yuan et al. | |
| 2015/0054580 A1 | 2/2015 | Yuan et al. | |
| 2015/0188498 A1 | 7/2015 | Yuan et al. | |
| 2015/0188503 A1 | 7/2015 | Yuan et al. | |
| 2015/0280659 A1 | 10/2015 | Yuan et al. | |
| 2015/0288336 A1 | 10/2015 | Kusuda | |
| 2016/0072444 A1 | 3/2016 | Gorbachov et al. | |
| 2016/0123780 A1 | 5/2016 | Snyder et al. | |
| 2016/0276993 A1 | 9/2016 | Tsurumi | |
| 2016/0344348 A1 | 11/2016 | Yuan et al. | |
| 2016/0373076 A1 * | 12/2016 | Buono | H03F 3/183 |
| 2017/0047896 A1 | 2/2017 | Shu et al. | |
| 2017/0194922 A1 | 7/2017 | Yuan et al. | |

(56) References Cited

U.S. PATENT DOCUMENTS

| | | | |
|---|---|---|---|
| 2017/0229917 A1* | 8/2017 | Kurs | B60L 53/12 |
| 2019/0116331 A1* | 4/2019 | Jung | H03M 1/0607 |
| 2020/0204130 A1 | 6/2020 | Yuan et al. | |
| 2020/0389131 A1 | 12/2020 | Yuan et al. | |

FOREIGN PATENT DOCUMENTS

| | | |
|---|---|---|
| CN | 101127510 A | 2/2008 |
| CN | 101282079 A | 10/2008 |
| CN | 101288227 A | 10/2008 |
| CN | 101663813 A | 3/2010 |
| CN | 103441739 A | 12/2013 |
| TW | 201105026 A1 | 10/2001 |
| TW | 200618464 A | 6/2006 |
| TW | M309289 | 4/2007 |
| TW | 201021405 A1 | 6/2010 |
| TW | 201116961 A1 | 5/2011 |
| TW | I 343173 | 6/2011 |

OTHER PUBLICATIONS

Chen et al., "A High-PSRR Reconfigurable Class-AB/D Audio Amplifier Driving a Hands-Free/Receiver 2-in-1 Loudspeaker," *IEEE Journal of Solid-State Ciruits*, vol. 47, No. 11, pp. 2586-2603 (Nov. 2012).
Chinese Patent Office, Office Action dated Aug. 5, 2014, in Application No. 201110268688.8.
Chinese Patent Office, Office Action dated Aug. 5, 2014, in Application No. 201110268690.5.
Chinese Patent Office, Office Action dated Jan. 20, 2014, in Application No. 201310368267.1.
Chinese Patent Office, Office Action dated Apr. 24, 2017, in Application No. 201510114573.1.
Gaalaas et al., "Intergrated Stereo $\Delta\Sigma$ Class D Amplifier," *IEEE Journal of Solid-State Circuits*, vol. 40, No. 12, pp. 2388-2397 (Dec. 2005).
Lee et al., "Fast Switching Charge Dump Assisted Class-D Audio Amplifier with High Fidelity and High Efficiency," 39th IEEE Annual Power Electronics Specialists Conference, pp. 3506-3511, Jun. 15-19, 2008.
Liu et al., "A 100 W 5.1-Channel Digital Class-D Audio Amplifier with Single-Chip Design," *IEEE Journal of Solid-State Circuits*, vol. 47, No. 6, pp. 1344-1354 (Jun. 2012).
Nagari et al., "An 8 $\Omega$ 2.5 W 1 %-THD 104 dB(A)-Dynamic-Range Class-D Audio Amplifier with Ultra-Low EMI System and Current Sensing for Speaker Protection," *IEEE Journal of Solid-State Ciruits*, vol. 47, No. 12, pp. 3068-3080 (Dec. 2012).

Taiwan Patent Office, Office Action dated Jul. 16, 2014, in Application No. 100137586.
Taiwan Patent Office, Office Action dated Oct. 9, 2014, in Application No. 101118860.
Taiwan Patent Office, Office Action dated Sep. 22, 2015, in Application No. 102145701.
Taiwan Patent Office, Office Action dated Nov. 11, 2016, in Application No. 104117212.
Teplechuk et al., "True Filterless Class-D Audio Amplifier," *IEEE Journal of Solid-State Circuits*, vol. 46, No. 12, pp. 2784-2793 (Dec. 2011).
United States Patent and Trademark Office, Office Action dated Jul. 20, 2016, in U.S. Appl. No. 14/595,822.
United States Patent and Trademark Office, Office Action dated Feb. 21, 2017, in U.S. Appl. No. 14/595,822.
United States Patent and Trademark Office, Office Action dated Sep. 20, 2017, in U.S. Appl. No. 14/595,822.
United States Patent and Trademark Office, Office Action dated Feb. 14, 2018, in U.S. Appl. No. 14/595,822.
United States Patent and Trademark Office, Office Action dated Aug. 10, 2018, in U.S. Appl. No. 14/595,822.
United States Patent and Trademark Office, Office Action dated Dec. 28, 2018, in U.S. Appl. No. 14/595,822.
United States Patent and Trademark Office, Office Action dated Apr. 17, 2019, in U.S. Appl. No. 14/595,822.
United States Patent and Trademark Office, Office Action dated Nov. 6, 2017, in U.S. Appl. No. 15/140,367.
United States Patent and Trademark Office, Office Action dated Sep. 28, 2018, in U.S. Appl. No. 15/140,367.
United States Patent and Trademark Office, Notice of Allowance dated Mar. 6, 2019, in U.S. Appl. No. 15/140,367.
United States Patent and Trademark Office, Office Action dated Jan. 17, 2019, in U.S. Appl. No. 15/418,313.
Yasuda et al., "A Class-D Amplifier Using a Spectrum Shaping Technique," Proceedings of the IEEE 2004 Custom Integrated Circuits Conference, pp. 173-176, Oct. 3-6, 2004.
United States Patent and Trademark Office, Notice of Allowance dated Sep. 2, 2020, in U.S. Appl. No. 16/661,906.
United States Patent and Trademark Office, Office Action dated Dec. 23, 2019, in U.S. Appl. No. 14/595,822.
United States Patent and Trademark Office, Notice of Allowance dated Jul. 26, 2019, in U.S. Appl. No. 15/418,313.
United States Patent and Trademark Office, Notice of Allowance dated Apr. 6, 2020, in U.S. Appl. No. 14/595,822.
United States Patent and Trademark Office, Notice of Allowance dated Jun. 1, 2020, in U.S. Appl. No. 16/661,906.
United States Patent and Trademark Office, Office Action dated Mar. 16, 2021, in U.S. Appl. No. 16/914,907.
United States Patent and Trademark Office, Office Action dated Oct. 27, 2020, in U.S. Appl. No. 16/914,907.

\* cited by examiner

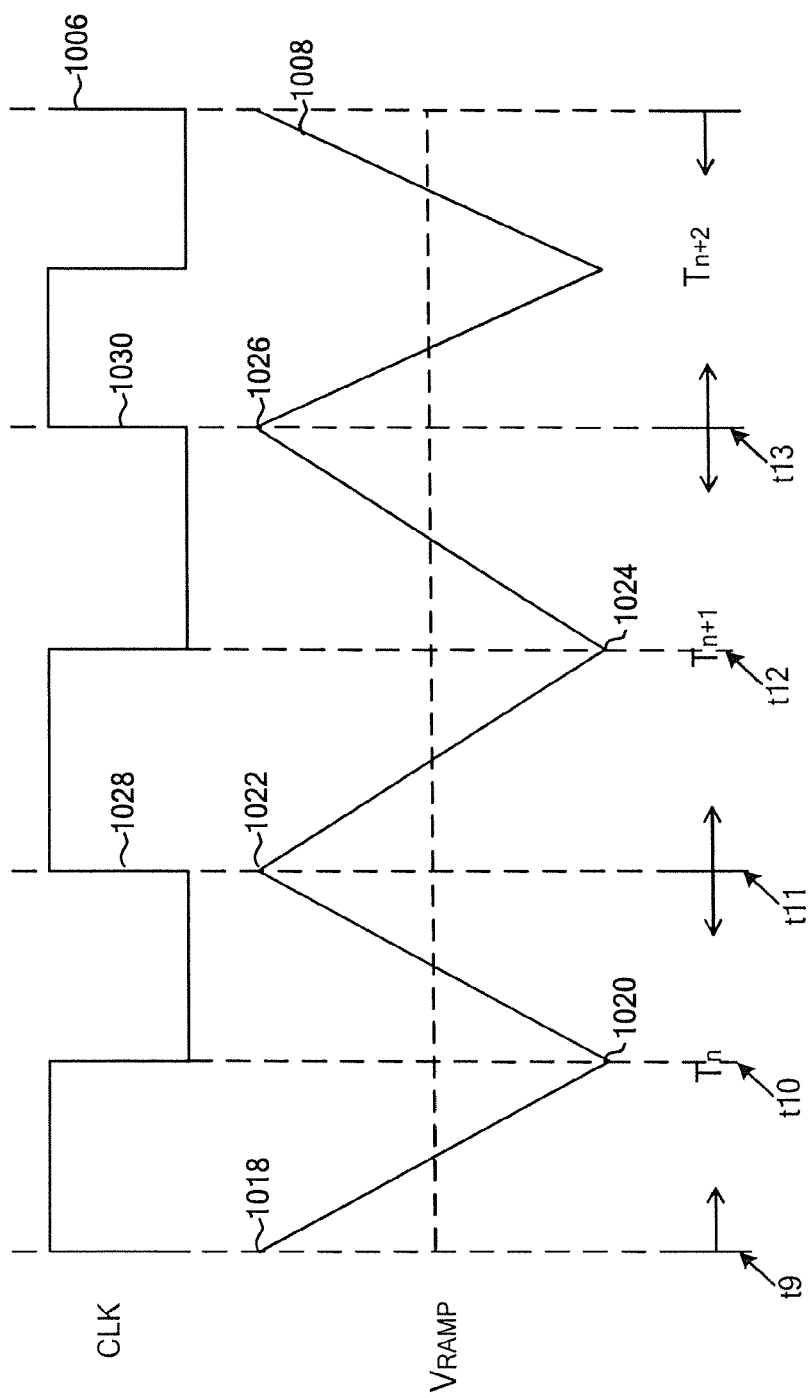

AMPLIFICATION SYSTEMS AND METHODS WITH ONE OR MORE CHANNELS

1. CROSS-REFERENCES TO RELATED APPLICATIONS

This application is a continuation of U.S. patent application Ser. No. 15/140,367, filed Apr. 27, 2016, which is a continuation of U.S. patent application Ser. No. 14/504,229, filed Oct. 1, 2014, which is a continuation of U.S. patent application Ser. No. 14/014,177, filed Aug. 29, 2013, which claims priority to Chinese Patent Application No. 201310368267.1, filed Aug. 21, 2013, all of the above-referenced applications being commonly assigned and incorporated by reference herein for all purposes.

2. BACKGROUND OF THE INVENTION

The present invention is directed to integrated circuits. More particularly, the invention provides amplification systems and methods with one or more channels. Merely by way of example, the invention has been applied to a Class-D amplifier. But it would be recognized that the invention has a much broader range of applicability.

FIG. 1 is a simplified conventional diagram showing an amplification system using a Class-D amplifier with one channel. The amplification system 100 includes a modulator 102, an output stage 104, a low-pass filter 106, and an output load 116. The modulator 102 includes an oscillator 108, a comparator 110 and a loop filter 112. For example, the output load 116 is a speaker. In another example, the modulator 102, the output stage 104, and the low-pass filter 106 are included in a Class-D amplifier. In yet another example, the low-pass filter 106 includes one or more inductors and/or one or more capacitors. In yet another example, the low-pass filter 106 includes one or more bead cores and/or one or more capacitors.

The loop filter 112 receives an input audio signal 118 and an output signal 120 (e.g., a pulse-width-modulation signal) and outputs a filtered signal 122 to the comparator 110. For example, the input audio signal 118 includes a pair of input signals. The oscillator 108 generates a clock signal 126 and a ramp signal 124 which is received by the comparator 110. The comparator 110 outputs a comparison signal 128 that indicates a comparison between the ramp signal 124 and the filtered signal 122. The output stage 104 receives the comparison signal 128 and generates the output signal 120. The low-pass filter 106 converts the output signal 120 to an audio signal 130 to drive the load 116. As shown in FIG. 1, one channel including the modulator 102 and the output stage 104 is implemented. Multiple channels may be used for audio-amplification applications.

In one embodiment, the loop filter 112 amplifies an error signal between the input signal 118 and a feedback signal associated with the output signal 120. For example, the loop filter 112 includes a low pass filter which has a very high gain (e.g., a high gain larger than 1000) in a low frequency range and a very low gain (e.g., a low gain much smaller than 1) in a high frequency range. In another example, if a signal includes a low-frequency component and a high-frequency component, the loop filter 112 amplifies the low-frequency component with a high gain and amplifies the high-frequency component with a low gain (e.g., a low gain much smaller than 1). In yet another example, if the high-frequency component is close to a switching frequency of the amplification system 100, the loop filter 112 attenuates the high-frequency component. In one embodiment, the loop filter 112 includes one or more stages of analog integrators.

FIG. 2 is a simplified conventional diagram for an amplification system with multiple channels. The amplification system 300 includes multiple channels $202_1, \ldots, 202_n, \ldots, 202_N$, where $N \geq 2$ and $1 \leq n \leq N$. The first channel $202_1$ includes a loop filter $204_1$, comparators $206_1$ and $208_1$, a logic controller $210_1$, driving components $212_1$ and $214_1$, transistors $216_1$, $218_1$, $220_1$ and $222_1$, and a low-pass filter $224_1$. The logic controller $210_1$ includes one or more buffers. For example, the low-pass filter $224_1$ includes one or more inductors and/or one or more capacitors. In another example, the low-pass filter $224_1$ includes one or more bead cores and/or one or more capacitors. Other channels have similar components as the first channel. As shown in FIG. 2, these channels $202_1, \ldots, 202_n, \ldots, 202_N$ share a common ramp signal 228 and generate output signals (e.g., $234_1, \ldots, 234_n, \ldots, 234_N$ and/or $236_1, \ldots, 236_n, \ldots, 236_N$) so that audio signals are provided to output loads $222_1, \ldots, 222_n, \ldots, 222_N$ (e.g., speakers) respectively.

In one embodiment, the loop filter $204_1$ amplifies the error signal between an input differential signal and a feedback differential signal associated with an output differential signal. The input differential signal represents a difference between the input signals $230_1$ and $232_1$, and the output differential signal represents a difference between the output signals $234_1$ and $236_1$. For example, the loop filter $204_1$ is a low pass filter and it has a very high gain (e.g., a high gain that is greater than 1000) in a low frequency range and a very low gain (e.g., a low gain that is much smaller than 1) in a high frequency range. In another example, if a signal includes a low-frequency component and a high-frequency component, the loop filter $204_1$ amplifies the low-frequency component with a high gain and amplifies the high-frequency component with a low gain (e.g., a low gain that is much smaller than 1). In yet another example, if the high-frequency component is close to a switching frequency of the amplification system 200, the loop filter $204_1$ attenuates the high-frequency component. In one embodiment, the loop filter $204_1$ includes one or more stages of analog integrators. In some embodiments, loop filters in other channels are the same as the loop filter $204_1$.

The amplification systems 100 and 200 often have certain disadvantages. Hence it is highly desirable to improve such amplification systems.

3. BRIEF SUMMARY OF THE INVENTION

The present invention is directed to integrated circuits. More particularly, the invention provides amplification systems and methods with one or more channels. Merely by way of example, the invention has been applied to a Class-D amplifier. But it would be recognized that the invention has a much broader range of applicability.

According to one embodiment, a system for amplifying multiple input signals to generate multiple output signals includes a first channel, a second channel, and a third channel. The first channel is configured to receive one or more first input signals, process information associated with the one or more first input signals and a first ramp signal, and generate one or more first output signals based on at least information associated with the one or more first input signals and the first ramp signal. The second channel is configured to receive one or more second input signals, process information associated with the one or more second input signals and a second ramp signal, and generate one or more second output signals based on at least information associated with the one or more second input signals and the second ramp signal. The third channel is configured to receive one or more third input signals, process information associated with the one or more third input signals and a third ramp signal, and generate one or more third output signals based on at least information associated with the one or more third input signals and the third ramp signal. The first ramp signal corresponds to a first phase. The second ramp signal corresponds to a second phase. The first phase and the second phase are different.

According to another embodiment, a system for amplifying multiple input signals to generate multiple output signals includes a first channel and a second channel. The first channel is configured to receive one or more first input signals, process information associated with the one or more first input signals and a first ramp signal, and generate one or more first output signals based on at least information associated with the one or more first input signals and the first ramp signal. The second channel is configured to receive one or more second input signals, process information associated with the one or more second input signals and a second ramp signal, and generate one or more second output signals based on at least information associated with the one or more second input signals and the second ramp signal. The first ramp signal corresponds to a first phase. The second ramp signal corresponds to a second phase. A difference between the first phase and the second phase is equal to 180 degrees.

According to yet another embodiment, a system for amplifying multiple input signals to generate multiple output signals includes a first channel and a second channel. The first channel includes a first loop filter, a first signal processing component and a first output component, and is configured to receive one or more first input signals, process information associated with the one or more first input signals and a ramp signal, and generate one or more first output signals based on at least information associated with the one or more first input signals and the ramp signal. The second channel includes a second loop filter, a second signal processing component and a second output component, and is configured to receive one or more second input signals, process information associated with the one or more second input signals and the ramp signal, and generate one or more second output signals based on at least information associated with the one or more second input signals and the ramp signal. The first loop filter is configured to process information associated with the one or more first input signals and generate one or more first filtered signals based on at least information associated with the one or more first input signals. The first signal processing component is configured to process information associated with the one or more first filtered signals and generate one or more first processed signals based on at least information associated with the one or more first filtered signals. The first output component is configured to process information associated with the one or more first processed signals and generate the one or more first output signals based on at least information associate with the one or more first processed signals. The second loop filter is configured to process the one or more second input signals and generate one or more second filtered signals based on at least information associated with the one or more second input signals. The second signal processing component is configured to process information associated with the one or more second filtered signals and generate one or more second processed signals based on at least information associated with the one or more second filtered signals. The second output component is configured to process information associated with the one or more second processed signals and generate the one or more second output signals based on at least information associate with the one or more second processed signals. The one or more first processed signals are associated with a first phase. The one or more second processed signals are associated with a second phase. A difference between the first phase and the second phase is equal to 180 degrees.

In one embodiment, a system for amplifying multiple input signals to generate multiple output signals includes a first channel and a second channel. The first channel includes a first loop filter and one or more first comparators, and is configured to receive one or more first input signals, process information associated with the one or more first input signals and a ramp signal, and generate one or more first output signals based on at least information associated with the one or more first input signals and the ramp signal. The second channel includes a second loop filter and one or more second comparators, and is configured to receive one or more second input signals, process information associated with the one or more second input signals and the ramp signal, and generate one or more second output signals based on at least information associated with the one or more second input signals and the ramp signal. The first loop filter is configured to process information associated with the one or more first input signals and generate one or more first filtered signals based on at least information associated with the one or more first input signals. The one or more first comparators include one or more first terminals and one or more second terminals and are configured to receive the one or more first filtered signals at the first terminals and the ramp signal at the second terminals, generate one or more first comparison signals based on at least information associated with the first filtered signals and the ramp signal, and output the one or more first comparison signals in order to generate the one or more first output signals. The second loop filter is configured to process information associated with the one or more second input signals and generate one or more second filtered signals based on at least information associated with the one or more second input signals. The one or more second comparators include one or more third terminals and one or more fourth terminals and are configured to receive the one or more second filtered signals at the third terminals and the ramp signal at the fourth terminals, generate one or more second comparison signals based on at least information associated with the second filtered signals and the ramp signal, and output the one or more second comparison signals in order to generate the one or more second output signals. The one or more second terminals include one or more inverting terminals and the one or more fourth terminals include one or more non-inverting terminals, or the one or more second terminals include one or more non-inverting terminals and the one or more fourth terminals include one or more inverting terminals.

In another embodiment, a system for amplifying one or more input signals to generate one or more output signals includes, an oscillator component configured to generate a ramp signal associated with a ramping frequency, a loop filter component configured to receive one or more input signals and generate one or more filtered signals based on at least information associated with the one or more input signals, and a comparator component configured to receive the one or more filtered signals and the ramp signal and generate one or more comparison signals based on at least information associated with the one or more filtered signals and the ramp signal. The oscillator component is further configured to, change the ramping frequency periodically so that one or more changes in the ramping frequency are made in each jittering period corresponding to a jittering frequency, and output the ramping signal associated with the changed ramping frequency. The jittering frequency is larger than an upper limit of a predetermined audio frequency range.

In yet another embodiment, a system for amplifying one or more input signals to generate one or more output signals includes, an oscillator component configured to generate a ramp signal associated with a ramping frequency, the ramping frequency corresponding to one or more ramping periods, a loop filter component configured to receive one or more input signals and generate one or more filtered signals based on at least information associated with the one or more input signals, and a comparator component configured to receive the one or more filtered signals and the ramp signal and generate one or more comparison signals based on at least information associated with the one or more filtered signals and the ramp signal. The oscillator component is further configured to, at an end of a first ramping period, change a charging current or a discharging current so that a first duration of the first ramping period differs from a second duration of a second ramping period following the first ramping period. The first duration and the second duration correspond to different magnitudes of the ramping frequency.

According one embodiment, a method for amplifying multiple input signals to generate multiple output signals includes, receiving one or more first input signals, processing information associated with the one or more first input signals and a first ramp signal, and generating one or more first output signals based on at least information associated with the one or more first input signals and the first ramp signal. The method further includes, receiving one or more second input signals, processing information associated with the one or more second input signals and a second ramp signal, and generating one or more second output signals based on at least information associated with the one or more second input signals and the second ramp signal. In addition, the method includes receiving one or more third input signals, processing information associated with the one or more third input signals and a third ramp signal, and generating one or more third output signals based on at least information associated with the one or more third input signals and the third ramp signal. The first ramp signal corresponds to a first phase. The second ramp signal corresponds to a second phase. The first phase and the second phase are different.

According to another embodiment, a method for amplifying multiple input signals to generate multiple output signals includes, receiving one or more first input signals, processing information associated with the one or more first input signals and a first ramp signal, and generating one or more first output signals based on at least information associated with the one or more first input signals and the first ramp signal. The method further includes, receiving one or more second input signals, processing information associated with the one or more second input signals and a second ramp signal, and generating one or more second output signals based on at least information associated with the one or more second input signals and the second ramp signal. The first ramp signal corresponds to a first phase. The second ramp signal corresponds to a second phase. A difference between the first phase and the second phase is equal to 180 degrees.

According to yet another embodiment, a method for amplifying multiple input signals to generate multiple output signals includes, receiving one or more first input signals by a first channel including a first loop filter, a first signal processing component and a first output component, processing information associated with the one or more first input signals and a ramp signal, and generating one or more first output signals based on at least information associated with the one or more first input signals and the ramp signal. The method further includes, receiving one or more second input signals by a second channel including a second loop filter, a second signal processing component and a second output component, processing information associated with the one or more second input signals and the ramp signal, and generating one or more second output signals based on at least information associated with the one or more second input signals and the ramp signal. The processing information associated with the one or more first input signals and a ramp signal includes, processing information associated with the one or more first input signals by the first loop filter, generating one or more first filtered signals based on at least information associated with the one or more first input signals, processing information associated with the one or more first filtered signals by the first signal processing component, and generating one or more first processed signals based on at least information associated with the one or more first filtered signals. The generating one or more first output signals based on at least information associated with the one or more first input signals and the ramp signal includes, processing information associated with the one or more first processed signals by the first output component, and generating the one or more first output signals based on at least information associate with the one or more first processed signals. The processing information associated with the one or more second input signals and the ramp signal includes, processing information associated with the one or more second input signals by the second loop filter, generating one or more second filtered signals based on at least information associated with the one or more second input signals, processing information associated with the one or more second filtered signals by the second signal processing component, and generating one or more second processed signals based on at least information associated with the one or more second filtered signals. The generating one or more second output signals based on at least information associated with the one or more second input signals and the ramp signal includes, processing information associated with the one or more second processed signals by the second output component, and generating the one or more second output signals based on at least information associate with the one or more second processed signals. The one or more first processed signals are associated with a first phase, the one or more second processed signals are associated with a second phase, and a difference between the first phase and the second phase is equal to 180 degrees.

In one embodiment, a method for amplifying multiple input signals to generate multiple output signals includes, receiving one or more first input signals by a first channel including a first loop filter and one or more first comparators, processing information associated with the one or more first input signals and a ramp signal, and generating one or more first output signals based on at least information associated with the one or more first input signals and the ramp signal. The method further includes, receiving one or more second input signals by a second channel including a second loop filter and one or more second comparators, processing information associated with the one or more second input signals and the ramp signal, and generating one or more second output signals based on at least information associated with the one or more second input signals and the ramp signal. The processing information associated with the one or more first input signals and a ramp signal includes, processing information associated with the one or more first input signals at the first loop filter, and generating one or more first filtered signals based on at least information associated with the one or more first input signals. The generating one or more first output signals based on at least information associated with the one or more first input signals and the ramp signal includes, receiving the one or more first filtered signals by one or more first terminals of the one or more first comparators, receiving the ramp signal by one or more second terminals of the one or more first comparators, generating one or more first comparison signals based on at least information associated with the first filtered signals and the ramp signal, outputting the one or more first comparison signals, and generating the one or more first output signals based on at least information associated with the one or more first comparison signals. The processing information associated with the one or more second input signals and the ramp signal includes, processing information associated with the one or more second input signals by the second loop filter, and generating one or more second filtered signals based on at least information associated with the one or more second input signals. The generating one or more second output signals based on at least information associated with the one or more second input signals and the ramp signal includes, receiving the one or more second filtered signals by one or more third terminals of the one or more second comparators, receiving the ramp signal by one or more fourth terminals of the one or more second comparators, generating one or more second comparison signals based on at least information associated with the second filtered signals and the ramp signal, outputting the one or more second comparison signals, and generating the one or more second output signals based on at least information associated with the one or more second comparison signals. The one or more second terminals include one or more inverting terminals and the one or more fourth terminals include one or more non-inverting terminals, or the one or more second terminals include one or more non-inverting terminals and the one or more fourth terminals include one or more inverting terminals.

In another embodiment, a method for amplifying one or more input signals to generate one or more output signals includes, generating a ramp signal associated with a ramping frequency, receiving one or more input signals, and processing information associated with the one or more input signals. The method further includes, generating one or more filtered signals based on at least information associated with the one or more input signals, receiving the one or more filtered signals and the ramp signal, processing information associated with the one or more filtered signals and the ramp signal, and generating one or more comparison signals based on at least information associated with the one or more filtered signals and the ramp signal. The generating a ramp signal associated with a ramping frequency includes, changing the ramping frequency periodically so that one or more changes in the ramping frequency are made in each jittering period corresponding to a jittering frequency, and outputting the ramping signal associated with the changed ramping frequency. The jittering frequency is larger than an upper limit of a predetermined audio frequency range.

In yet another embodiment, a method for amplifying one or more input signals to generate one or more output signals includes, generating a ramp signal associated with a ramping frequency, the ramping frequency corresponding to one or more ramping periods, receiving one or more input signals, and processing information associated with the one or more input signals. The method further includes, generating one or more filtered signals based on at least information associated with the one or more input signals, receiving the one or more filtered signals and the ramp signal, and generating one or more comparison signals based on at least information associated with the one or more filtered signals and the ramp signal. The generating a ramp signal associated with a ramping frequency includes changing a charging current or a discharging current at an end of a first ramping period so that a first duration of the first ramping period differs from a second duration of a second ramping period following the first ramping period. The first duration and the second duration correspond to different magnitudes of the ramping frequency.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

FIG. 8(b) is a simplified timing diagram for the oscillator as shown in FIG. 8(a) as part of an amplification system according to one embodiment of the present invention.

5. DETAILED DESCRIPTION OF THE INVENTION

The present invention is directed to integrated circuits. More particularly, the invention provides amplification systems and methods with one or more channels. Merely by way of example, the invention has been applied to a Class-D amplifier. But it would be recognized that the invention has a much broader range of applicability.

Figure 1:
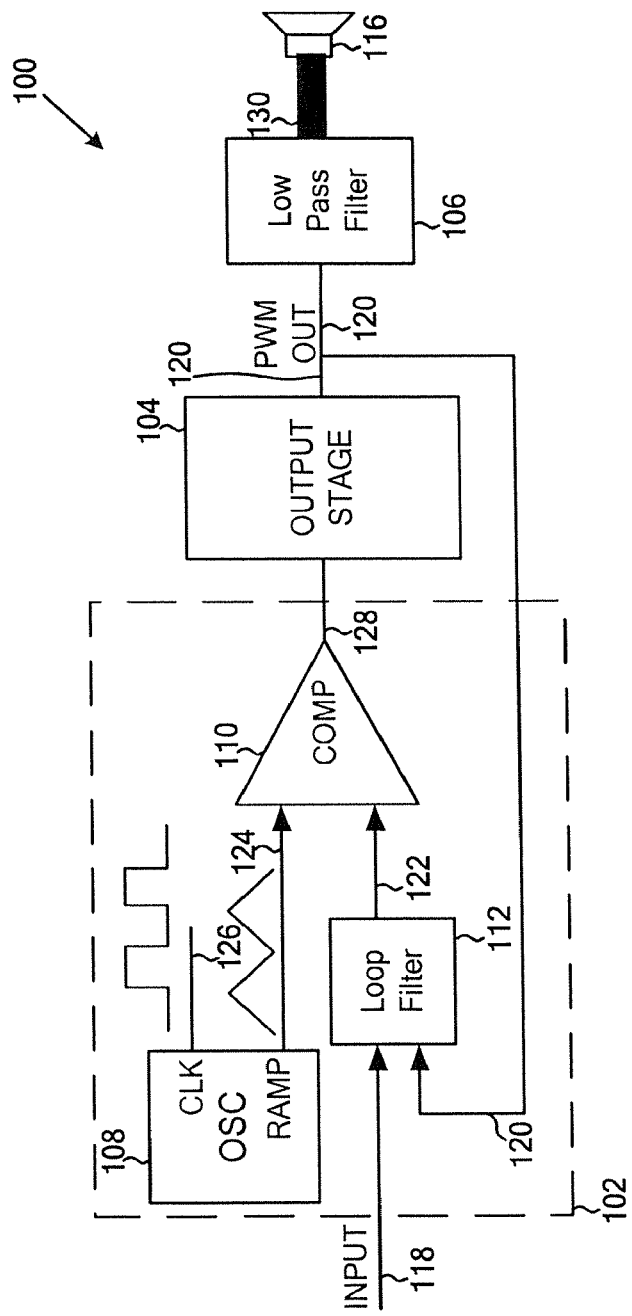
FIG. 1 is a simplified conventional diagram showing an amplification system using a Class-D amplifier with one channel.
Figure 2:
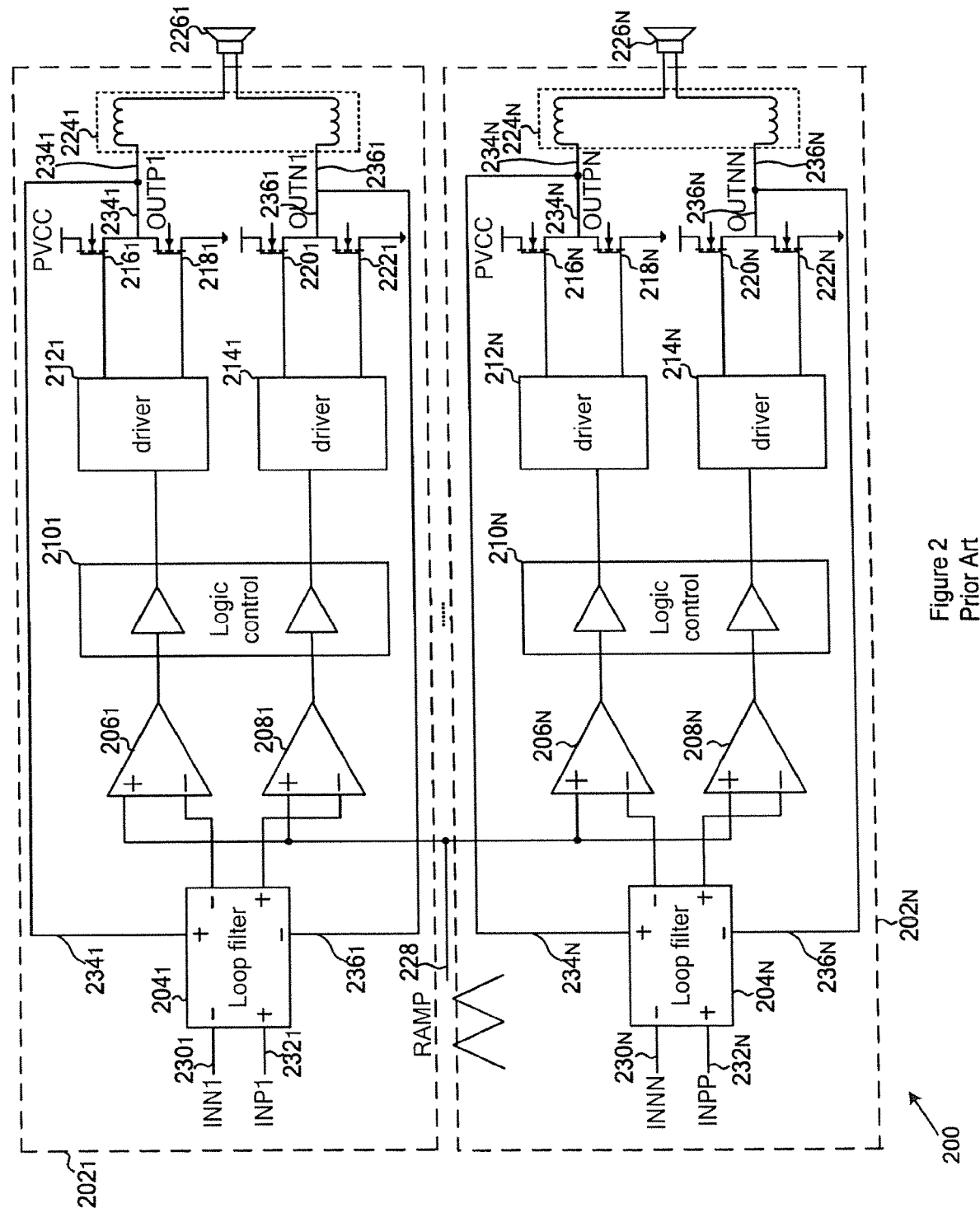
FIG. 2 is a simplified conventional diagram for an amplification system with multiple channels.

Referring to FIG. 2, as multiple channels receive a common ramp signal, the output signals (e.g., $234_1, \ldots, 234_n, \ldots, 234_N$ and/or $236_1, \ldots, 236_n, \ldots, 236_N$) may be of a same frequency and have a same phase. That is, all power stages may be turned on and off at approximately the same time, which often causes a large ripple for the power supply that is applied to the amplification system 200.

Figure 3:
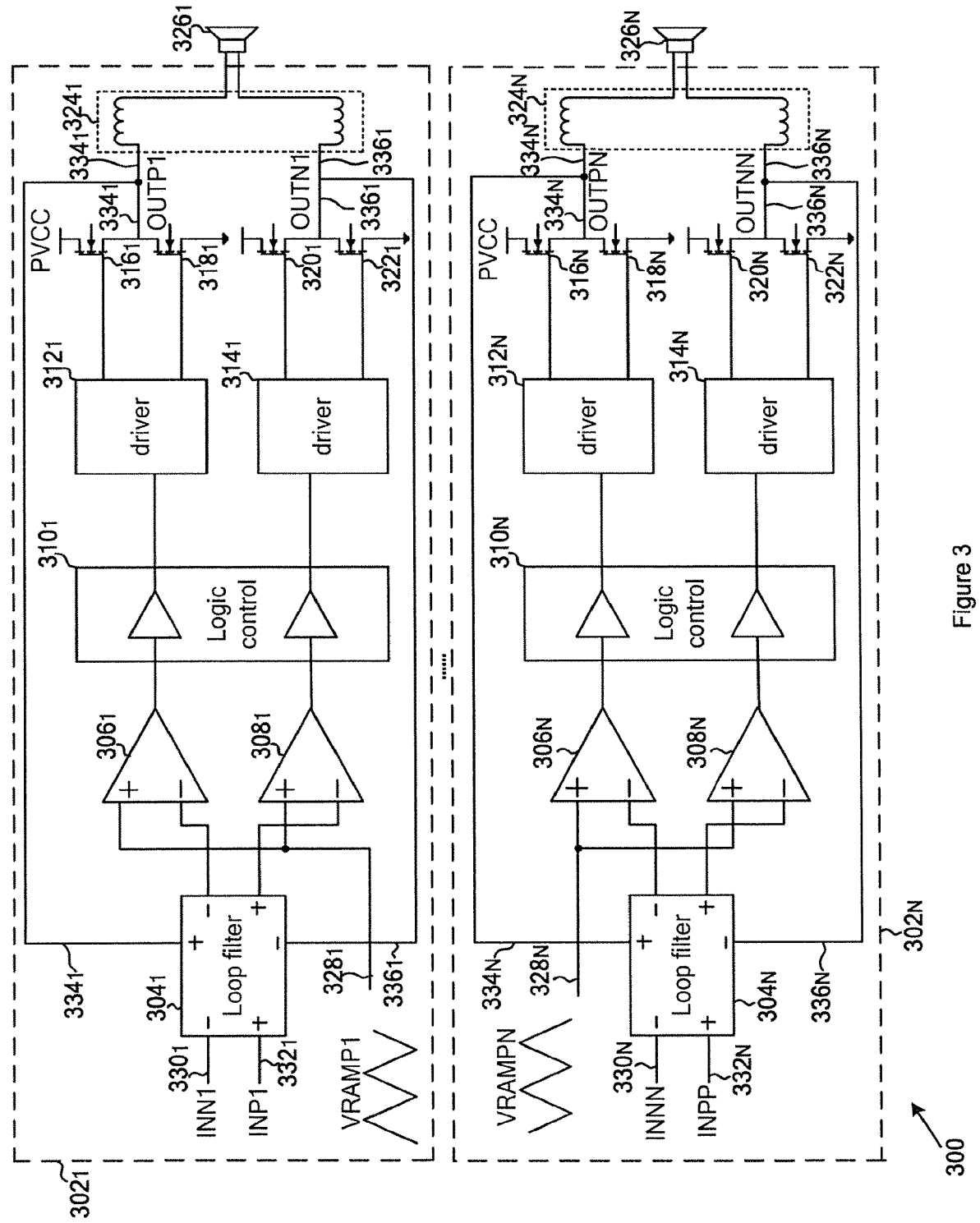
FIG. 3 is a simplified diagram for an amplification system with multiple channels according to an embodiment of the present invention.

FIG. 3 is a simplified diagram for an amplification system with multiple channels according to an embodiment of the present invention. This diagram is merely an example, which should not unduly limit the scope of the claims. One of ordinary skill in the art would recognize many variations, alternatives, and modifications. The amplification system 300 includes multiple channels $302_1, \ldots, 302_n, \ldots, 302_N$, where $N \geq 2$ and $1 \leq n \leq N$.

As an example, the first channel $302_1$ includes a loop filter $304_1$, comparators $306_1$ and $308_1$, a logic controller $310_1$, driving components $312_1$ and $314_1$, transistors $316_1$, $318_1$, $320_1$ and $322_1$, and a low-pass filter $324_1$. Other channels have similar components as the first channel, according to certain embodiments. For example, the transistors $316_1$, $318_1$, $320_1$, and $322_1$ are N-channel transistors. As an example, the logic controller $310_1$ includes one or more buffers. In another example, the low-pass filter $324_1$ includes one or more inductors and/or one or more capacitors. In yet another example, the low-pass filter $324_1$ includes one or more bead cores and/or one or more capacitors. In one embodiment, the loop filter $304_1$ amplifies the error signal between an input differential signal and a feedback differential signal associated with an output differential signal. The input differential signal represents a difference between the input signals $332_1$ and $330_1$, and the output differential signal represents a difference between the output signals $334_1$ and $336_1$. For example, the loop filter $304_1$ includes a low pass filter which has a very high gain (e.g., a high gain larger than 1000) in a low frequency range and a very low gain (e.g., a low gain much smaller than 1) in a high frequency range. In another example, if a signal includes a low-frequency component and a high-frequency component, the loop filter $304_1$ amplifies the low-frequency component with a high gain and amplifies the high-frequency component with a low gain (e.g., a low gain much smaller than 1). In yet another example, if the high-frequency component is close to a switching frequency of the amplification system 300, the loop filter $304_1$ attenuates the high-frequency component. In one embodiment, the loop filter $304_1$ includes one or more stages of analog integrators.

According to some embodiments, ramp signals (e.g., $328_1, \ldots, 328_N$) received by different channels have a same frequency but different phases. In one embodiment, the phase shifts between the ramps signals received by different channels are equal. As an example, the first channel $302_1$ receives the ramp signal $328_1$ for processing input signals $330_1$ and $332_1$. In another embodiment, the second channel $302_2$ (not shown in FIG. 3) receives a ramp signal $328_2$ and the phase shift between the ramp signal $328_2$ and the ramp signal $328_1$ is $$\frac{2\pi}{N},$$

the phase shift between a ramp signal $328_3$ received by the third channel $302_3$ (not shown in FIG. 3) and the ramp signal $328_1$ is $$\frac{4\pi}{N},$$

and the phase shift between the ramp signal $328_N$ received by the last channel $302_N$ and the ramp signal $328_1$ is $$\frac{2\pi \times (N-1)}{N}.$$

In yet another embodiment, the phase shifts between the ramps signals received by different channels are different. As an example, the phase shift between the first channel $302_1$ and the second channel $302_2$ is different from the phase shift between the second channel $302_2$ and the third channel $302_3$.

Figure 4:
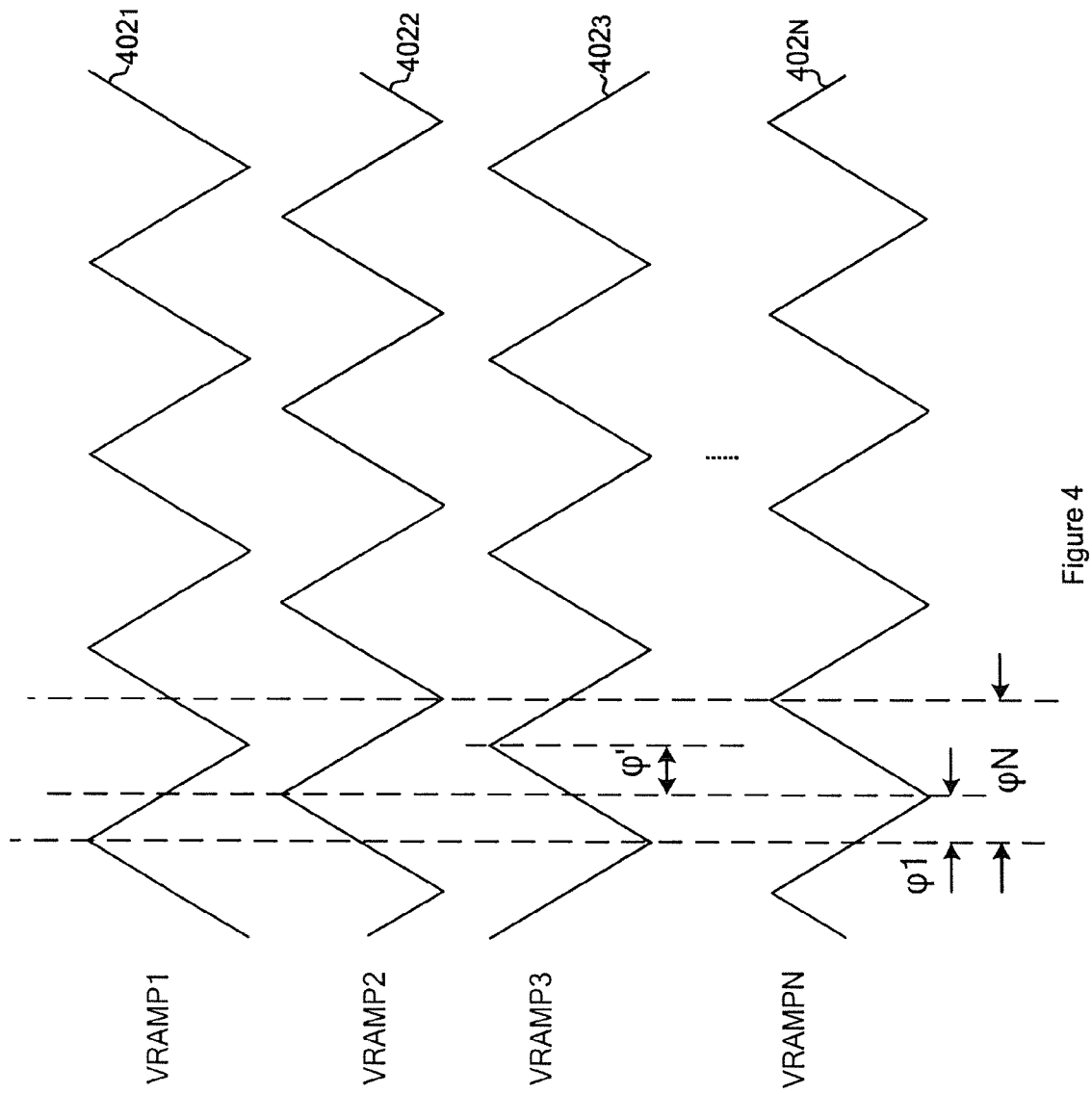
FIG. 4 is a simplified timing diagram for the amplification system as shown in FIG. 3 according to an embodiment of the present invention.

FIG. 4 is a simplified timing diagram for the amplification system 300 according to an embodiment of the present invention. This diagram is merely an example, which should not unduly limit the scope of the claims. One of ordinary skill in the art would recognize many variations, alternatives, and modifications. The waveform $402_1$ represents the ramp signal $328_1$ as a function of time, the waveform $402_2$ represents the ramp signal $328_2$ as a function of time, the waveform $402_3$ represents the ramp signal $328_3$ as a function of time, and the waveform $402_N$ represent the ramp signal $328_N$ as a function of time. As shown in FIG. 4, the phase shift between the ramp signal $328_1$ and the ramp signal $328_2$ is $\varphi_1$, the phase shift between the ramp signal $328_2$ and the ramp signal $328_3$ is $\varphi'$, and the phase shift between the ramp signal $328_1$ and the ramp signal $328_N$ is $\varphi_N$, according to certain embodiments. For example, the phase shift $\varphi_1$ is equal to or different from the phase shift $\varphi'$.

Figure 5A:
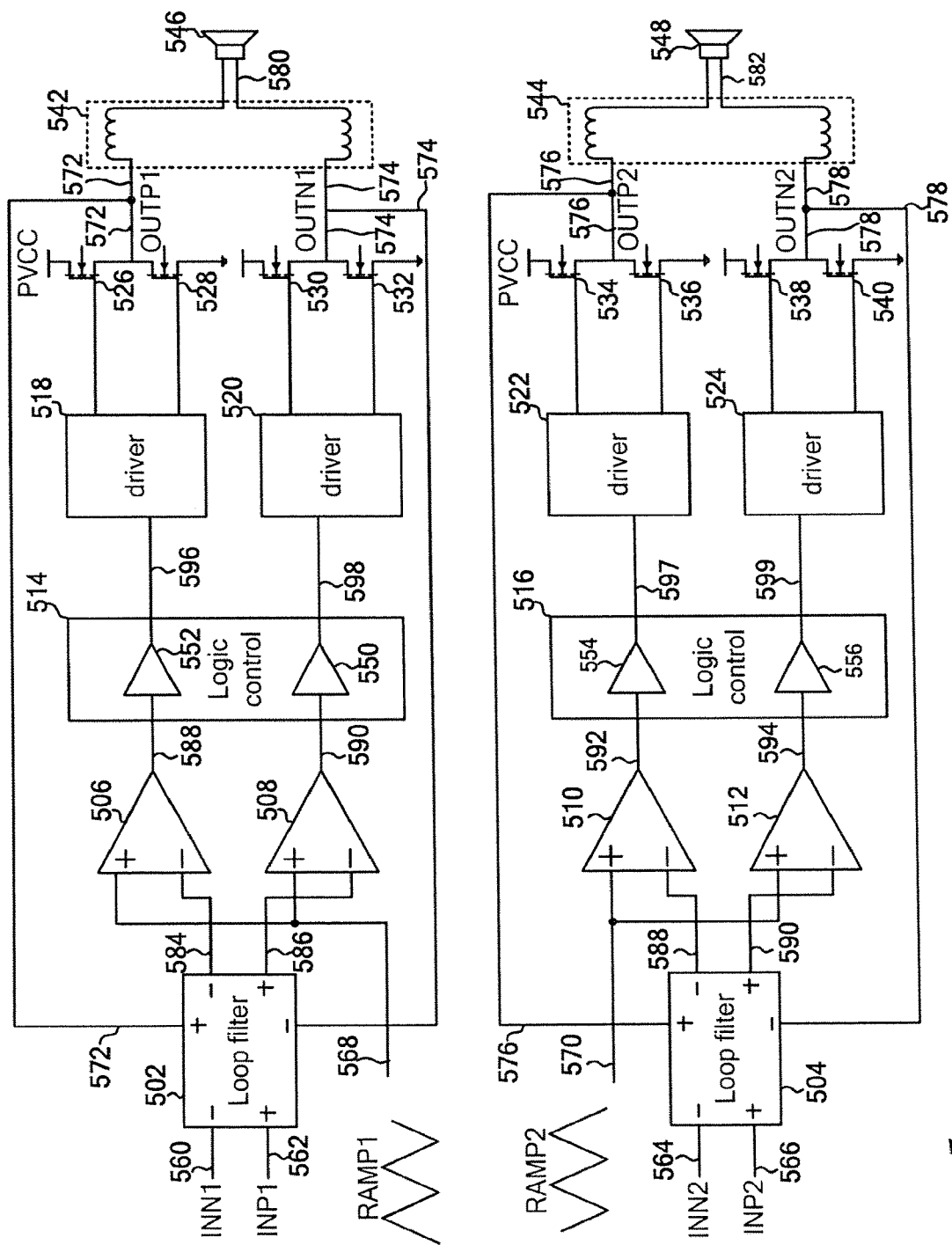
FIG. 5(a) is a simplified diagram showing an amplification system with two channels according to an embodiment of the present invention.

FIG. 5(a) is a simplified diagram showing an amplification system with two channels according to an embodiment of the present invention. This diagram is merely an example, which should not unduly limit the scope of the claims. One of ordinary skill in the art would recognize many variations, alternatives, and modifications. The amplification system 500 includes loop filters 502 and 504, comparators 506, 508, 510 and 512, logic controllers 514 and 516, driving components 518, 520, 522 and 524, transistors 526, 528, 530, 532, 534, 536, 538 and 540, and low-pass filters 542 and 544. For example, the amplification system 500 is the amplification system 300 with N equals to 2.

In one embodiment, the loop filter 502, the comparators 506 and 508, the logic controller 514, the driving components 518 and 520, the transistors 526, 528, 530 and 532, and the low-pass filter 542 are included in a first channel. In another embodiment, the loop filter 504, the comparators 510 and 512, the logic controller 516, the driving components 522 and 524, the transistors 534, 536, 538 and 540, and the low-pass filter 544 are included in a second channel. The logic controller 514 includes two buffers 550 and 552, and the logic controller 516 includes two buffers 554 and 556. In some embodiments, the transistors 526, 528, 530, 532, 534, 536, 538 and 540 are N-channel transistors, for example, N-channel metal-oxide-semiconductor field effect transistors (MOSFETs). In certain embodiments, the transistors 526, 530, 534 and 538 are P-channel transistors (e.g., P-channel MOSFETs), and the transistors 528, 532, 536, and 540 are N-channel transistors (e.g., N-channel MOSFETs). As an example, the low-pass filters 542 and 544 each include one or more inductors and/or one or more capacitors. In another example, the low-pass filters 542 and 544 each include one or more bead cores and/or one or more capacitors.

In yet another example, the loop filter 502, the comparators 506 and 508, the logic controller 514, the driving components 518 and 520, the transistors 526, 528, 530 and 532, and the low-pass filter 542 are the same as the loop filter $304_1$, the comparators $306_1$ and $308_1$, the logic controller $310_1$, the driving components $312_1$ and $314_1$, the transistors $316_1$, $318_1$, $320_1$ and $322_1$, and the low-pass filter $324_1$, respectively. In yet another example, the loop filter 504, the comparators 510 and 512, the logic controller 516, the driving components 522 and 524, the transistors 534, 536, 538 and 540, and the low-pass filter 544 are the same as the loop filter $304_1$, the comparators $306_1$ and $308_1$, the logic controller $310_1$, the driving components $312_1$ and $314_1$, the transistors $316_1$, $318_1$, $320_1$ and $322_1$, and the low-pass filter $324_1$, respectively.

According to one embodiment, the first channel receives input signals 560 and 562 and a ramp signal 568 and generates output signals 572 and 574 to provide one or more audio signals 580 to an output load 546 (e.g., a speaker). Specifically, for example, the loop filter 502 receives the input signals 560 and 562 and generates filtered signals 584 and 586 which are received by the comparators 506 and 508, respectively. As an example, the comparators 506 and 508 also receive the ramp signal 568 and generate comparison signals 588 and 590, respectively. The logic controller 514 outputs signals 596 and 598 to the driving components 518 and 520, respectively. For example, the loop filter 502 receives the output signals 572 and 574 as feedbacks. In one example, if the comparison signal 588 is at a logic high level, the signal 596 is at the logic high level, and if the comparison signal 588 is at a logic low level, the signal 596 is at the logic low level. In another example, if the comparison signal 590 is at the logic high level, the signal 598 is at the logic high level, and if the comparison signal 590 is at the logic low level, the signal 598 is at the logic low level.

According to another embodiment, the second channel receives input signals 564 and 566 and a ramp signal 570 and generates output signals 576 and 578 to provide one or more audio signals 582 to an output load 548 (e.g., a speaker). Specifically, for example, the loop filter 504 receives the input signals 564 and 566 and generates filtered signals 588 and 590 which are received by the comparators 510 and 512, respectively. As an example, the comparators 510 and 512 also receive the ramp signal 570 and generate comparison signals 592 and 594, respectively. The logic controller 516 outputs signals 597 and 599 to the driving components 522 and 524, respectively. For example, the loop filter 504 receives the output signals 576 and 578 as feedbacks. In one example, if the comparison signal 592 is at the logic high level, the signal 597 is at the logic high level, and if the comparison signal 592 is at the logic low level, the signal 597 is at the logic low level. In another example, if the comparison signal 594 is at the logic high level, the signal 599 is at the logic high level, and if the comparison signal 594 is at the logic low level, the signal 599 is at the logic low level.

As an example, the ramp signals 568 and 570 are of the same frequency, and the phase shift between the ramp signal 568 and the ramp signal 570 is $\pi$ (e.g., 180°). That is, the ramp signal 568 is out of phase with the ramp signal 570.

In one embodiment, the loop filter 502 amplifies the error signal between an input differential signal and a feedback differential signal associated with an output differential signal. The input differential signal represents a difference between the input signals 560 and 562, and the output differential signal represents a difference between the output signals 572 and 574. For example, the loop filter 502 is a low pass filter and it has a very high gain (e.g., a high gain that is greater than 1000) in a low frequency range and a very low gain (e.g., a low gain that is much smaller than 1) in a high frequency range. In another example, if a signal includes a low-frequency component and a high-frequency component, the loop filter 502 amplifies the low-frequency component with a high gain and amplifies the high-frequency component with a low gain (e.g., a low gain that is much smaller than 1). In yet another example, if the high-frequency component is close to a switching frequency of the amplification system 500, the loop filter 502 attenuates the high-frequency component. In one embodiment, the loop filter 502 includes one or more stages of analog integrators. In some embodiments, the loop filter 504 is the same as the loop filter 502.

Figure 5B:
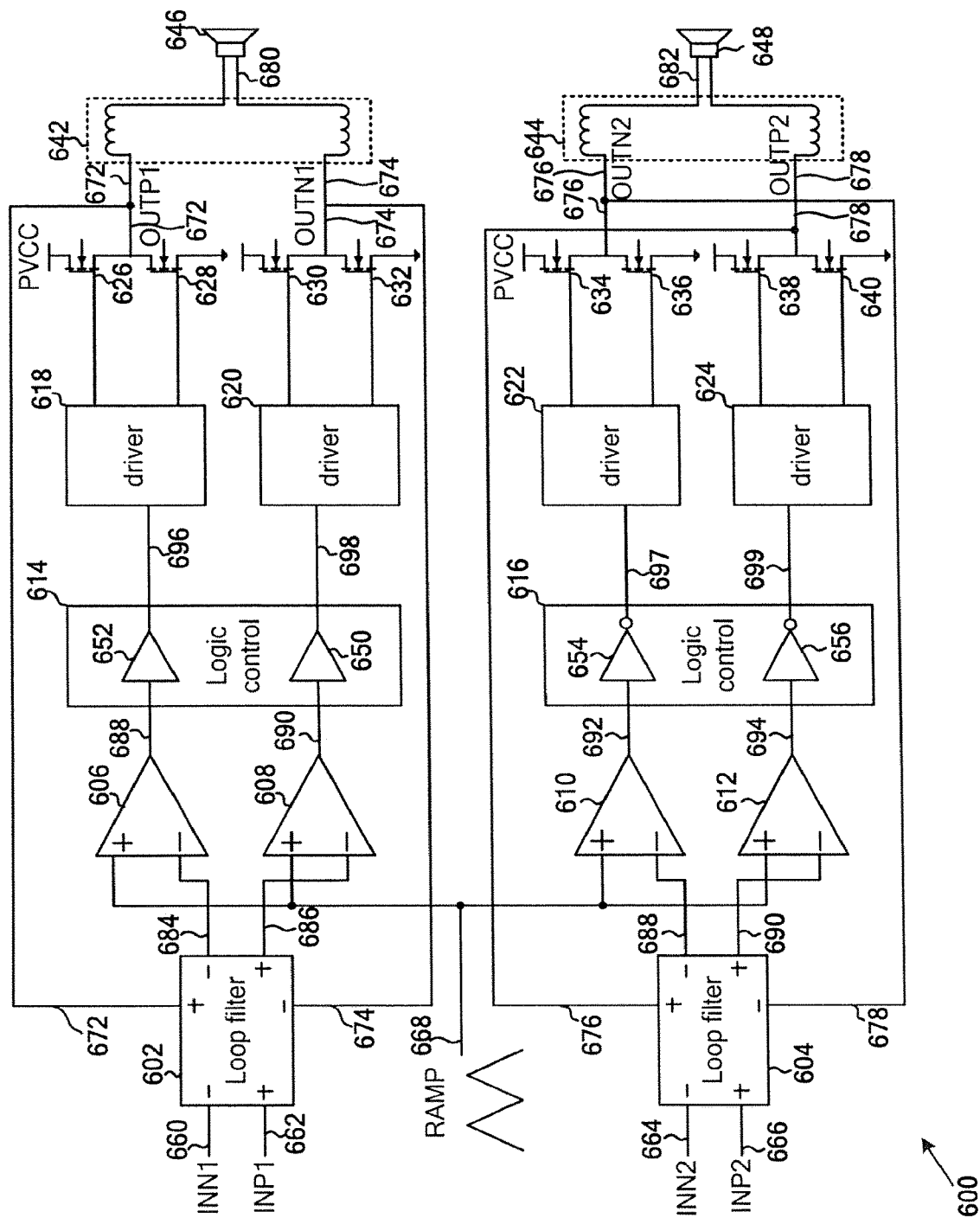
FIG. 5(b) is a simplified diagram showing an amplification system with two channels according to another embodiment of the present invention.

FIG. 5(b) is a simplified diagram showing an amplification system with two channels according to another embodiment of the present invention. This diagram is merely an example, which should not unduly limit the scope of the claims. One of ordinary skill in the art would recognize many variations, alternatives, and modifications. The amplification system 600 includes loop filters 602 and 604, comparators 606, 608, 610 and 612, logic controllers 614 and 616, driving components 618, 620, 622 and 624, transistors 626, 628, 630, 632, 634, 636, 638 and 640, and low-pass filters 642 and 644.

In one embodiment, the loop filter 602, the comparators 606 and 608, the logic controller 614, the driving components 618 and 620, the transistors 626, 628, 630 and 632, and the low-pass filter 642 are included in a first channel. In another embodiment, the loop filter 604, the comparators 610 and 612, the logic controller 616, the driving components 622 and 624, the transistors 634, 636, 638 and 640, and the low-pass filter 644 are included in a second channel. The logic controller 614 includes two buffers 650 and 652, and the logic controller 616 includes two NOT gates 654 and 656. In some embodiments, the transistors 626, 628, 630, 632, 634, 636, 638 and 640 are N-channel transistors, for example, N-channel MOSFETs. In certain embodiments, the transistors 626, 630, 634 and 638 are P-channel transistors (e.g., P-channel MOSFETs), and the transistors 628, 632, 636, and 640 are N-channel transistors (e.g., N-channel MOSFETs). As an example, the low-pass filters 642 and 644 each include one or more inductors and/or one or more capacitors. In another example, the low-pass filters 642 and 644 each include one or more bead cores and/or one or more capacitors. In yet another example, the loop filter 602, the comparators 606 and 608, the logic controller 614, the driving components 618 and 620, the transistors 626, 628, 630 and 632, and the low-pass filter 642 are the same as the loop filter $304_1$, the comparators $306_1$ and $308_1$, the logic controller $310_1$, the driving components $312_1$ and $314_1$, the transistors $316_1$, $318_1$, $320_1$ and $322_1$, and the low-pass filter $324_1$, respectively. In yet another example, the loop filter 604, and the comparators 610 and 612 are the same as the loop filter $304_1$, the comparators $306_1$ and $308_1$, respectively.

According to one embodiment, the first channel receives input signals 660 and 662 and a ramp signal 668 and generates output signals 672 and 674 to provide one or more audio signals 680 to an output load 646 (e.g., a speaker). Specifically, for example, the loop filter 602 receives the input signals 660 and 662 and the output signals 672 and 674 as feedbacks, and generates filtered signals 684 and 686 which are received by the comparators 606 and 608, respectively. As an example, the comparators 606 and 608 also receive the ramp signal 668 and generate comparison signals 688 and 690, respectively. The logic controller 614 outputs signals 696 and 698 to the driving components 618 and 620, respectively. For example, if the comparison signal 688 is at a logic high level, the signal 696 is at the logic high level, and if the comparison signal 688 is at a logic low level, the signal 696 is at the logic low level. In another example, if the comparison signal 690 is at the logic high level, the signal 698 is at the logic high level, and if the comparison signal 690 is at the logic low level, the signal 698 is at the logic low level. In certain embodiments, the logic controller 614 is removed, and the signals 688 and 690 are the same as the signals 696 and 698, respectively. For example, the comparators 606, 608, 610 and 612 each receive the ramp signal 668 at a non-inverting terminal (e.g., a "+" terminal). In another example, the comparators 606, 608, 610 and 612 each receive the ramp signal 668 at an inverting terminal (e.g., a "−" terminal).

According to another embodiment, the second channel receives input signals 664 and 666 and the ramp signal 668 and generates output signals 676 and 678 to provide one or more audio signals 682 to an output load 648 (e.g., a speaker). Specifically, for example, the loop filter 604 receives the input signals 664 and 666 and the output signals 676 and 678 as feedbacks, and generates filtered signals 688 and 690 which are received by the comparators 610 and 612, respectively. As an example, the comparators 610 and 612 also receive the ramp signal 668 and generate comparison signals 692 and 694, respectively. The logic controller 616 outputs signals 697 and 699 to the driving components 622 and 624, respectively. For example, if the comparison signal 692 is at the logic high level, the signal 697 is at the logic low level, and if the comparison signal 694 is at the logic low level, the signal 697 is at the logic high level. In another example, if the comparison signal 694 is at the logic high level, the signal 699 is at the logic low level, and if the comparison signal 694 is at the logic low level, the signal 699 is at the logic high level. In yet another example, the comparators 606 receives the signal 684 at an inverting terminal (e.g., a "−" terminal); the comparators 608 receives the signal 686 at an inverting terminal (e.g., a "−" terminal); the comparators 610 receives the signal 688 at an inverting terminal (e.g., a "−" terminal); and the comparators 612 receives the signal 690 at an inverting terminal (e.g., a "−" terminal).

In one embodiment, the loop filter 602 amplifies the error signal between an input differential signal and a feedback differential signal associated with an output differential signal. The input differential signal represents a difference between the input signals 660 and 662, and the output differential signal represents a difference between the output signals 672 and 674. For example, the loop filter 602 is a low pass filter and it has a very high gain (e.g., a high gain that is greater than 1000) in a low frequency range and a very low gain (e.g., a low gain that is much smaller than 1) in a high frequency range. In another example, if a signal includes a low-frequency component and a high-frequency component, the loop filter 602 amplifies the low-frequency component with a high gain and amplifies the high-frequency component with a low gain (e.g., a low gain that is much smaller than 1). In yet another example, if the high-frequency component is close to a switching frequency of the amplification system 600, the loop filter 602 attenuates the high-frequency component. In one embodiment, the loop filter 602 includes one or more stages of analog integrators. In some embodiments, the loop filter 604 is the same as the loop filter 602.

Figure 5C:
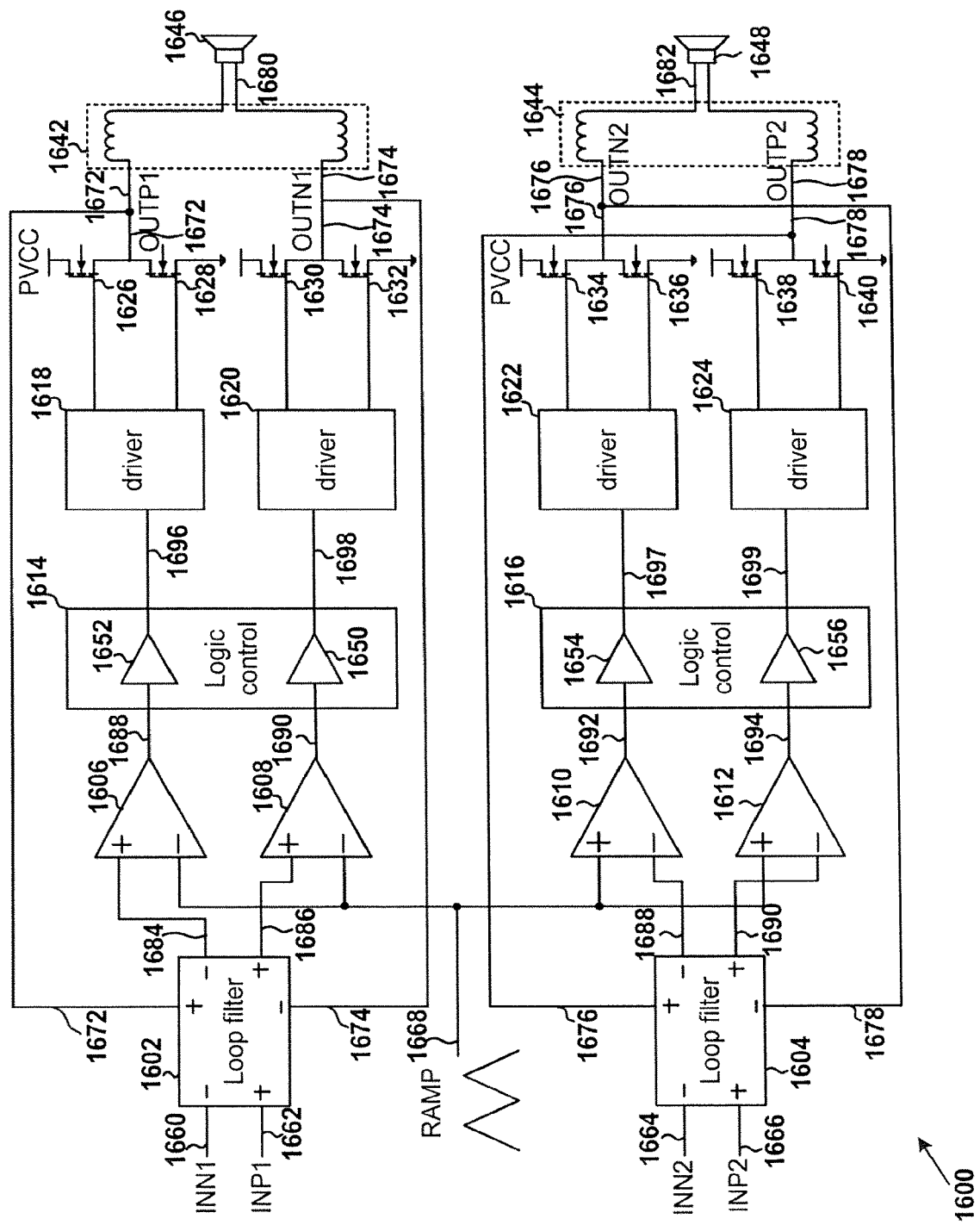
FIG. 5(c) is a simplified diagram showing an amplification system with two channels according to yet another embodiment of the present invention.

FIG. 5(c) is a simplified diagram showing an amplification system with two channels according to yet another embodiment of the present invention. This diagram is merely an example, which should not unduly limit the scope of the claims. One of ordinary skill in the art would recognize many variations, alternatives, and modifications. The amplification system 1600 includes loop filters 1602 and 1604, comparators 1606, 1608, 1610 and 1612, logic controllers 1614 and 1616, driving components 1618, 1620, 1622 and 1624, transistors 1626, 1628, 1630, 1632, 1634, 1636, 1638 and 1640, and low-pass filters 1642 and 1644.

In one embodiment, the loop filter 1602, the comparators 1606 and 1608, the logic controller 1614, the driving components 1618 and 1620, the transistors 1626, 1628, 1630 and 1632, and the low-pass filter 1642 are included in a first channel. In another embodiment, the loop filter 1604, the comparators 1610 and 1612, the logic controller 1616, the driving components 1622 and 1624, the transistors 1634, 1636, 1638 and 1640, and the low-pass filter 1644 are included in a second channel. The logic controller 1614 includes two buffers 1650 and 1652, and the logic controller 1616 includes two buffers 1654 and 1656. In some embodiments, the transistors 1626, 1628, 1630, 1632, 1634, 1636, 1638 and 1640 are N-channel transistors, for example, N-channel MOSFETs. In certain embodiments, the transistors 1626, 1630, 1634 and 1638 are P-channel transistors (e.g., P-channel MOSFETs), and the transistors 1628, 1632, 1636, and 1640 are N-channel transistors (e.g., N-channel MOSFETs). As an example, the low-pass filters 1642 and 1644 each include one or more inductors and/or one or more capacitors. In another example, the low-pass filters 1642 and 1644 each include one or more bead cores and/or one or more capacitors. In yet another example, the loop filter 1602, the comparators 1606 and 1608, the logic controller 1614, the driving components 1618 and 1620, the transistors 1626, 1628, 1630 and 1632, and the low-pass filter 1642 are the same as the loop filter $304_1$, the comparators $306_1$ and $308_1$, the logic controller $310_1$, the driving components $312_1$ and $314_1$, the transistors $316_1$, $318_1$, $320_1$ and $322_1$, and the low-pass filter $324_1$, respectively. In yet another example, the loop filter 1604, and the comparators 1610 and 1612 are the same as the loop filter $304_1$, the comparators $306_1$ and $308_1$, respectively.

According to one embodiment, the first channel receives input signals 1660 and 1662 and a ramp signal 1668 and generates output signals 1672 and 1674 to provide one or more audio signals 1680 to an output load 1646 (e.g., a speaker). Specifically, for example, the loop filter 1602 receives the input signals 1660 and 1662 and the output signals 1672 and 1674 as feedbacks, and generates filtered signals 1684 and 1686 which are received by the comparators 1606 and 1608, respectively. As an example, the comparators 1606 and 1608 also receive the ramp signal 1668 and generate comparison signals 1688 and 1690, respectively. The logic controller 1614 outputs signals 1696 and 1698 to the driving components 1618 and 1620, respectively. For example, if the comparison signal 1688 is at a logic high level, the signal 1696 is at the logic high level, and if the comparison signal 1688 is at a logic low level, the signal 1696 is at the logic low level. In another example, if the comparison signal 1690 is at the logic high level, the signal 1698 is at the logic high level, and if the comparison signal 1690 is at the logic low level, the signal 1698 is at the logic low level. In certain embodiments, the logic controller 1614 is removed, and the signals 1688 and 1690 are the same as the signals 1696 and 1698, respectively. In some embodiments, the logic controller 1616 is removed, and the signals 1692 and 1694 are the same as the signals 1697 and 1699, respectively. For example, the comparators 1610 and 1612 each receive the ramp signal 1668 at a non-inverting terminal (e.g., a "+" terminal), and the comparators 1606 and 1608 each receive the ramp signal 1668 at an inverting terminal (e.g., a "−" terminal).

According to another embodiment, the second channel receives input signals 1664 and 1666 and the ramp signal 1668 and generates output signals 1676 and 1678 to provide one or more audio signals 1682 to an output load 1648 (e.g., a speaker). Specifically, for example, the loop filter 1604 receives the input signals 1664 and 1666 and the output signals 1676 and 1678 as feedbacks, and generates filtered signals 1688 and 1690 which are received by the comparators 1610 and 1612, respectively. As an example, the comparators 1610 and 1612 also receive the ramp signal 1668 and generate comparison signals 1692 and 1694, respectively. In another example, the logic controller 1616 outputs signals 1697 and 1699 to the driving components 1622 and 1624, respectively. In yet another example, the comparators 1606 receives the signal 1684 at a non-inverting terminal (e.g., a "+" terminal); the comparators 1608 receives the signal 1686 at a non-inverting terminal (e.g., a "+" terminal); the comparators 1610 receives the signal 1688 at an inverting terminal (e.g., a "−" terminal); and the comparators 1612 receives the signal 1690 at an inverting terminal (e.g., a "−" terminal).

In one embodiment, the loop filter 1602 amplifies the error signal between an input differential signal and a feedback differential signal associated with an output differential signal. The input differential signal represents a difference between the input signals 1660 and 1662, and the output differential signal represents a difference between the output signals 1672 and 1674. For example, the loop filter 1602 is a low pass filter and it has a very high gain (e.g., a high gain that is greater than 1000) in a low frequency range and a very low gain (e.g., a low gain that is much smaller than 1) in a high frequency range. In another example, if a signal includes a low-frequency component and a high-frequency component, the loop filter 1602 amplifies the low-frequency component with a high gain and amplifies the high-frequency component with a low gain (e.g., a low gain that is much smaller than 1). In yet another example, if the high-frequency component is close to a switching frequency of the amplification system 1600, the loop filter 1602 attenuates the high-frequency component. In one embodiment, the loop filter 1602 includes one or more stages of analog integrators. In some embodiments, the loop filter 1604 is the same as the loop filter 1602.

As discussed above and further emphasized here, FIG. 3, FIG. 5(a), FIG. 5(b) and FIG. 5(c) are merely examples, which should not unduly limit the scope of the claims. One of ordinary skill in the art would recognize many variations, alternatives, and modifications. For example, the phase shift between the ramp signals 568 and 570 is not equal to $\pi$. In another example, the channels $302_1, \ldots, 302_N$ each include a separate oscillator for generating the ramp signals $328_1, \ldots, 328_N$, respectively. In yet another example, the channels $302_1, \ldots, 302_N$ share a common oscillator which generates the ramp signals $328_1, \ldots, 328_N$. In yet another example, the two channels as shown in FIG. 5(a) each include a separate oscillator for generating the ramp signals 568 and 570, respectively. In yet another example, the two channels as shown in FIG. 5(a) share a common oscillator which generates the ramp signals 568 and 570.

Referring back to FIG. 2, the amplification system 200 often involves a high switching frequency, and electromagnetic interference issues may be important.

Figure 6:
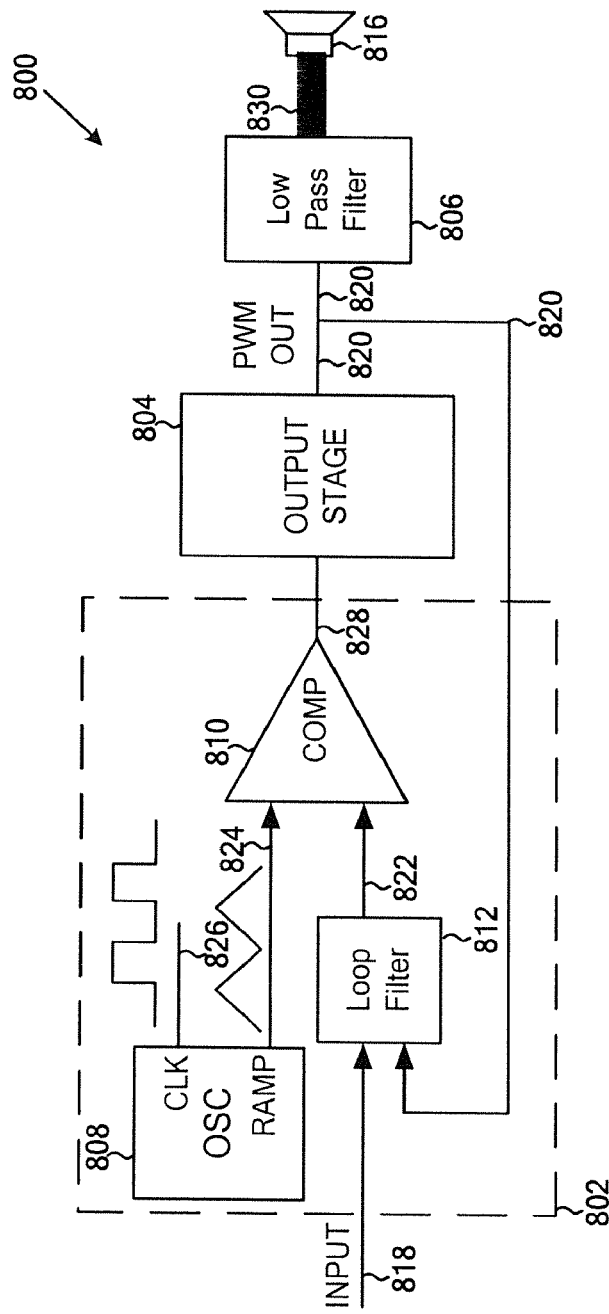
FIG. 6 is a simplified diagram for an amplification system according to an embodiment of the present invention.

FIG. 6 is a simplified diagram for an amplification system according to an embodiment of the present invention. This diagram is merely an example, which should not unduly limit the scope of the claims. One of ordinary skill in the art would recognize many variations, alternatives, and modifications. The amplification system 800 includes a modulator 802, an output stage 804, a low-pass filter 806, and an output load 816. The modulator 802 includes a loop filter 812, an oscillator 808, and a comparator 810. For example, the output load 816 is a speaker. In another example, the low pass filter 806 includes one or more inductors and/or one or more capacitors. In yet another example, the low-pass filter 806 includes one or more bead cores and/or one or more capacitors. In yet another example, the modulator 802, the output stage 804, and the low-pass filter 806 are included in a Class-D amplifier.

According to one embodiment, the loop filter 812 receives an input audio signal 818 and outputs a filtered signal 822 to the comparator 810. For example, the input audio signal 818 includes a pair of input signals. In another example, the oscillator 808 generates a clock signal 826 and a ramp signal 824. As an example, the comparator 810 receives the ramp signal 824 and provides a comparison signal 828 to the output stage 804 which generates an output signal 820. In one example, the loop filter 812 receives the output signal 820 as a feedback. For example, the low-pass filter 806 converts the output signal 820 to an audio signal 830 to drive the load 816. As shown in FIG. 6, the modulator 802, the output stage 804 and the low-pass filter 806 may be included in one channel of a multi-channel amplification system, according to certain embodiments. For example, the output signal 820 includes one or more signals. In another example, the output signal 820 represents a difference between two signals.

According to another embodiment, the oscillator 808 is configured to provide periodic jittering to the oscillation frequency of the clock signal 826 and/or the ramping frequency of the ramp signal 824. For example, the oscillation frequency of the clock signal 826 and/or the ramping frequency of the ramp signal 824 vary in a particular range in response to the periodic jittering. In another example, the frequency (e.g., a repeat rate) of the periodical jittering is larger than an upper limit of an audio frequency range (e.g., of about 20 Hz to about 20 KHz). In yet another example, the oscillation frequency of the clock signal 826 is equal to the ramping frequency of the ramp signal 824.

According to yet another embodiment, the oscillator 808 is configured to provide a combination of the periodic jittering and pseudo-random jittering to the oscillation frequency of the clock signal 826 and/or the ramping frequency of the ramp signal 824. For example, the oscillation frequency of the clock signal 826 and/or the ramping frequency of the ramp signal 824 varies in a particular range in response to the combination of the periodic jittering and pseudo-random jittering. In another example, the frequency (e.g., a repeat rate) of the pseudo-random jittering is smaller than a lower limit of an audio frequency range (e.g., of about 20 Hz to about 20 KHz).

According to yet another embodiment, the ramp signal 824 is associated with one or more ramping periods which are related to the ramping frequency of the ramp signal 824. For example, the oscillator 808 is configured to adjust the ramp signal 824 in a first ramping period to affect a slope of the ramp signal 824 in a next ramping period and/or the duration of the next ramping period. Specifically, the oscillator 808 is configured to change a ramp-up slope and/or a ramp-down slope associated with the ramp signal 824 (e.g., in a periodic manner or in a pseudo-random manner), in some embodiments. According to certain embodiments, the amplification system 800 as shown in FIG. 6 can be implemented in one or more channels as shown in FIG. 3, FIG. 5(a), and/or FIG. 5(b) to further improve the one or more channels. For example, periodic jittering or a combination of periodic jittering and pseudo-random jittering is provided to the one or more channels that implement an amplification system similar to the amplification system 800.

In one embodiment, the loop filter 812 amplifies an error signal between the input signal 818 and a feedback signal associated with the output signal 820. For example, the loop filter 812 includes a low pass filter which has a very high gain (e.g., a high gain larger than 1000) in a low frequency range and a very low gain (e.g., a low gain much smaller than 1) in a high frequency range. In another example, if a signal includes a low-frequency component and a high-frequency component, the loop filter 812 amplifies the low-frequency component with a high gain and amplifies the high-frequency component with a low gain (e.g., a low gain much smaller than 1). In yet another example, if the high-frequency component is close to a switching frequency of the amplification system 800, the loop filter 812 attenuates the high-frequency component. In one embodiment, the loop filter 812 includes one or more stages of analog integrators.

Figure 7:
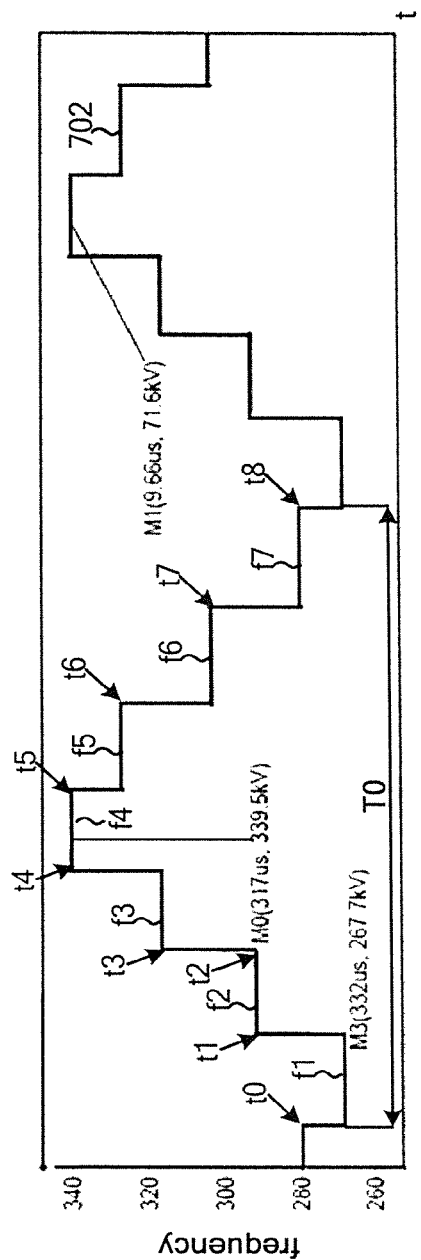
FIG. 7 is a simplified timing diagram for the oscillator with periodic uttering as part of the amplification system as shown in FIG. 6 according to an embodiment of the present invention.

FIG. 7 is a simplified timing diagram for the oscillator 808 with periodic jittering as part of the amplification system 800 according to an embodiment of the present invention. This diagram is merely an example, which should not unduly limit the scope of the claims. One of ordinary skill in the art would recognize many variations, alternatives, and modifications. The waveform 702 represents an oscillation frequency associated with the clock signal 826 and/or a ramping frequency associated with the ramp signal 824 of the oscillator 808 as a function of time. A jittering period $T_0$ that starts at $t_0$ and ends at $t_8$ is shown in FIG. 7. For example, $t_0 \leq t_1 \leq t_2 \leq t_3 \leq t_4 \leq t_5 \leq t_6 \leq t_7 \leq t_8$.

According to one embodiment, multiple frequency steps appear in the jittering period $T_0$, where each frequency step corresponds to a particular oscillation frequency value or a particular ramping frequency value. For example, between $t_0$ and $t_1$, the oscillation frequency or the ramping frequency has a value of $f_1$. As an example, the oscillation frequency or the ramping frequency increases to another value $f_2$ between $t_1$ and $t_2$, and then increase to a value $f_3$ between $t_3$ and $t_4$. Between $t_4$ and $t_5$, the oscillation frequency or the ramping frequency reaches a peak value $f_4$ within the jittering period $T_0$, according to certain embodiments. As an example, between $t_5$ and $t_8$, the oscillation frequency or the ramping frequency decreases in value till the end of the jittering period $T_0$, and then a next jittering period begins. For example, the frequency values $f_1$, $f_2$, $f_3$, $f_4$, $f_5$, $f_6$, and $f_7$ appear during the next jittering period again. In another example, a repeat rate of the frequency jittering (e.g., the repeating of the jittering sequence) is inversely proportional to the jittering period $T_0$. In yet another example, the repeat rate is larger in magnitude than an upper limit of an audio frequency range (e.g., of about 20 Hz to about 20 kHz). As an example, the frequency of the audio signal 830 is not affected by the frequency jittering as shown in FIG. 7, according to some embodiments.

Figure 8A:
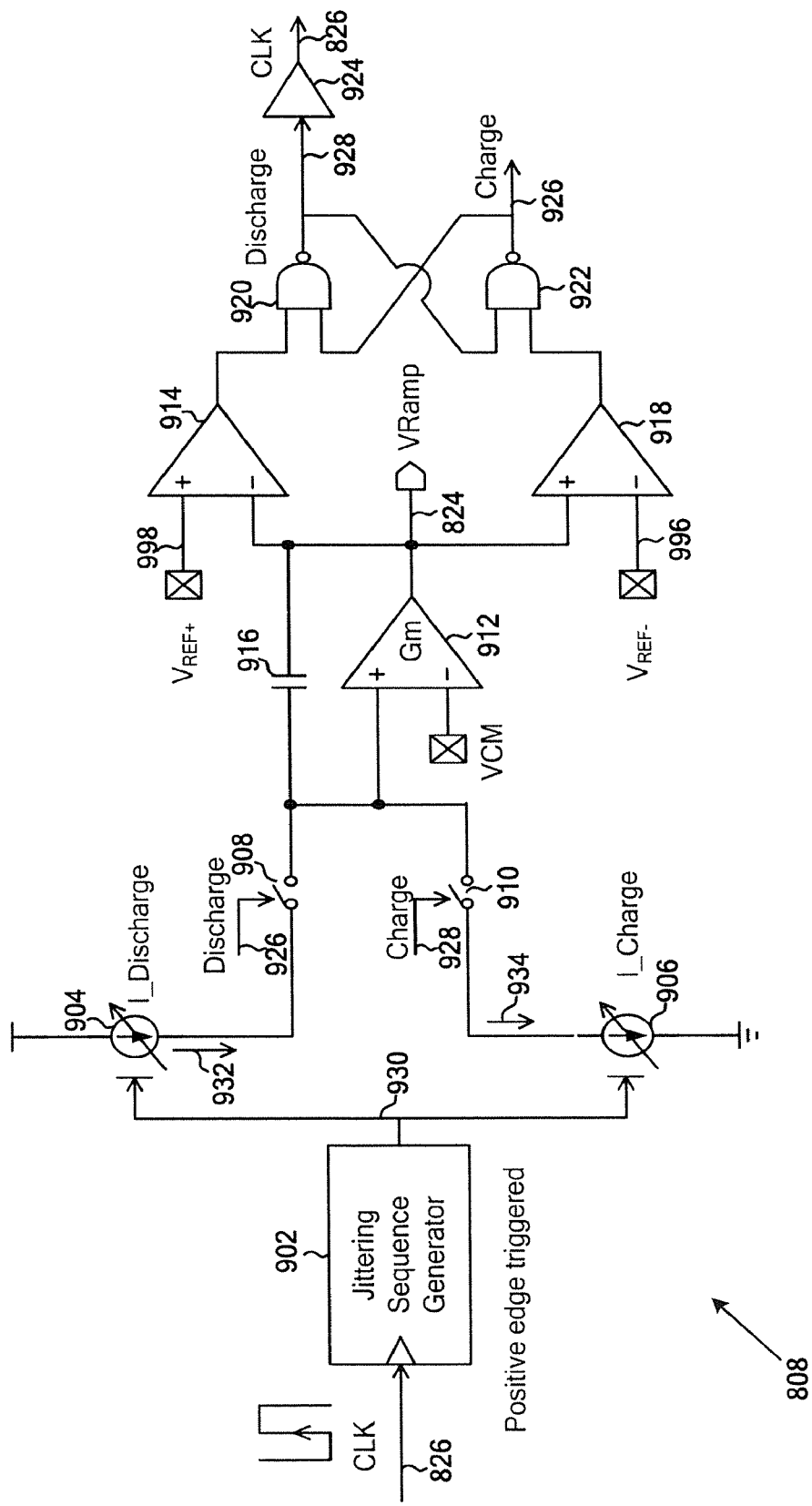
FIG. 8(a) is a simplified diagram showing certain components of the oscillator with periodic jittering as part of the amplification system as shown in FIG. 6 according to one embodiment of the present invention.

FIG. 8(a) is a simplified diagram showing certain components of the oscillator 808 with periodic jittering as part of the amplification system 800 according to one embodiment of the present invention. This diagram is merely an example, which should not unduly limit the scope of the claims. One of ordinary skill in the art would recognize many variations, alternatives, and modifications. The oscillator 808 includes a jittering-sequence generator 902, current sources 904 and 906, switches 908 and 910, a transconductance amplifier 912, a capacitor 916, comparators 914 and 918, NAND gates 920 and 922, and a buffer 924.

According to one embodiment, the jittering-sequence generator 902 receives the clock signal 826 and generates a signal 930 to trigger a change of a charging current 932 related to the current source 904 and/or the discharging current 934 related to the current source 906. For example, the switch 908 is opened or closed in response to a charging signal 926, and the switch 910 is opened or closed in response to a discharging signal 928. In one example, if the charging signal 926 is at a logical high level, the discharging signal 928 is at a logic low level, and if the charging signal 926 is at a logic low level, the discharging signal 928 is at a logic high level. In another example, the clock signal 826 changes between the logic high level and the logic low level similar to the discharging signal 928. For example, the clock signal 826 is associated with one or more oscillation periods corresponding to the oscillation frequency of the clock signal 826. In another example, the ramp signal 824 is associated with one or more ramping periods corresponding to the ramping frequency of the ramp signal 824. In yet another example, a switching period is equal in duration to a ramping period. In yet another example, a switching period and a ramping period start at a same time and end at a same time. In yet another example, in a ramping period, the ramp signal 824 increases in magnitude during a time period within the ramping period, and decreases in magnitude during another time period within the ramping period.

According to another embodiment, the jittering-sequence generator 902 detects a rising edge of the clock signal 826, and generates the signal 930 to change the charging current 932 and/or the discharging current 934 to jitter the frequency of the clock signal 826 and/or the ramping frequency of the ramp signal 824. For example, the change of the oscillation frequency of the clock signal 826 and/or the ramping frequency of the ramp signal 824 is determined by the magnitude of the charging current 932 and/or the discharging current 934. In another example, at the rising edge of the clock signal 826, the ramp signal 824 reaches a peak magnitude during the ramping period. In yet another example, the charging current 932 is equal in magnitude to the discharging current 934. In yet another example, the current 932 and the current 934 are equal in magnitude. In yet another example, a charging period for charging the capacitor 916 is determined based on a comparison between the ramp signal 824 and a reference signal 998 (e.g., $V_{REF+}$). In yet another example, a discharging period for discharging the capacitor 916 is determined based on a comparison between the ramp signal 824 and a reference signal 996 (e.g., $V_{REF-}$).

FIG. 8(b) is a simplified timing diagram for the oscillator 808 as shown in FIG. 8(a) as part of the amplification system 800 according to one embodiment of the present invention. This diagram is merely an example, which should not unduly limit the scope of the claims. One of ordinary skill in the art would recognize many variations, alternatives, and modifications. The waveform 1006 represents the clock signal 826 as a function of time and the waveform 1008 represents the ramp signal 824 as a function of time. For example, $t_9 \leq t_{10} \leq t_{11} \leq t_{12} \leq t_{13}$.

According to one embodiment, as shown in FIG. 8(b), during a first ramping period (e.g., $T_n$), the ramp signal 824 decreases from a magnitude 1018 (e.g., at $t_9$) to a magnitude 1020 (e.g., at $t_{10}$), and then increases to a magnitude 1022 (e.g., at $t_{11}$). For example, during the ramping period (e.g., $T_n$), the charging current 932 and/or the discharging current 934 keeps at a first magnitude within a particular range (e.g., the range between a maximum magnitude and a minimum magnitude). At $t_{11}$, a second ramping period (e.g., $T_{n+1}$) begins, and a rising edge 1028 appears in the clock signal 826, according to some embodiments. For example, the jittering-sequence generator 902 outputs the signal 930 to change the charging current 932 and/or the discharging current 934 to jitter the oscillation frequency of the clock signal 826 and/or the ramping frequency of the ramp signal 824. In another example, a slope of the ramp signal 824 in the second ramping period (e.g., $T_{n+1}$) becomes different from that in the first ramping period (e.g., $T_n$) in response to the change of the charging current 932 and/or the discharging current 934. In yet another example, the duration of the second ramping period (e.g., $T_{n+1}$) becomes different from that of the first ramping period (e.g., $T_n$) in response to the change of the charging current 932 and/or the discharging current 934. In some embodiments, the change of the slope of the ramp signal 824 (e.g., a ramp-up slope and/or a ramp-down slope) results in a change in the ramping frequency associated with the ramp signal 824 and/or the oscillation frequency associated with the clock signal 826.

According to another embodiment, during the second ramping period (e.g., $T_{n+1}$), the ramp signal 824 decreases from the magnitude 1022 (e.g., at $t_{11}$) to a magnitude 1024 (e.g., at $t_{12}$), and then increases to a magnitude 1026 (e.g., at $t_{13}$). For example, during the second ramping period (e.g., $T_{n+1}$), the charging current 932 and/or the discharging current 934 keeps at a second magnitude within the range between the maximum magnitude and the minimum magnitude. In another example, the second magnitude is different from the first magnitude. At $t_{13}$, a third ramping period (e.g., $T_{n+2}$) begins, and another rising edge 1030 appears in the clock signal 826, according to some embodiments. For example, the jittering-sequence generator 902 changes the signal 930 to change the charging current 932 and/or the discharging current 934 again to jitter the oscillation frequency of the clock signal 826 and/or the ramping frequency of the ramp signal 824. In another example, a slope of the ramp signal 824 in the third ramping period (e.g., $T_{n+2}$) becomes different from that in the second ramping period (e.g., $T_{n+1}$) in response to the change of the charging current 932 and/or the discharging current 934. In yet another example, the duration of the third ramping period (e.g., $T_{n+2}$) becomes different from that of the second ramping period (e.g., $T_{n+1}$) in response to the change of the charging current 932 and/or the discharging current 934. In some embodiments, the change of the slope of the ramp signal 824 (e.g., a ramp-up slope and/or a ramp-down slope) results in a change in the ramping frequency associated with the ramp signal 824 and/or the oscillation frequency associated with the clock signal 826. For example, the magnitudes 1018, 1022 and 1026 of the ramp signal 824 are related to the reference signal 998 (e.g., $V_{REF+}$), and the magnitudes 1020 and 1024 of the ramp signal 824 are related to the reference signal 996 (e.g., $V_{REF-}$).

Figure 8C:
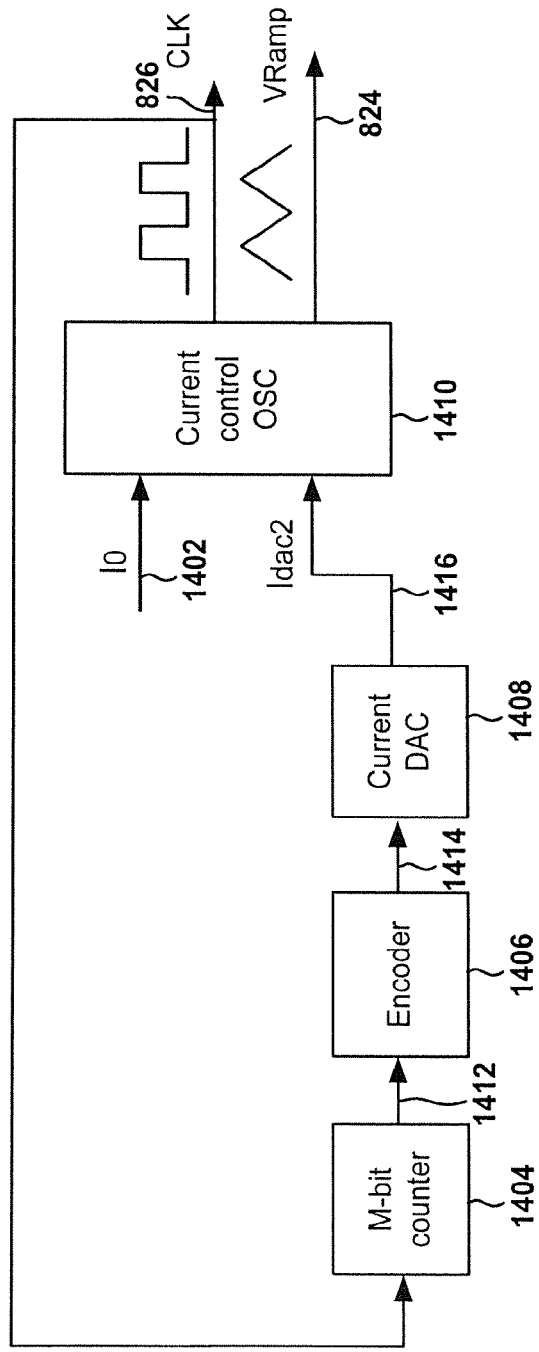
FIG. 8(c) is a simplified diagram showing certain components of the oscillator with periodic jittering as part of the amplification system as shown in FIG. 6 according to another embodiment of the present invention.

FIG. 8(c) is a simplified diagram showing certain components of the oscillator 808 with periodic jittering as part of the amplification system 800 according to another embodiment of the present invention. This diagram is merely an example, which should not unduly limit the scope of the claims. One of ordinary skill in the art would recognize many variations, alternatives, and modifications. The oscillator 808 includes a current-controlled oscillation component 1410, an encoder 1406, a current digital-analog converter (DAC) 1408, and a counter component 1404. For example, the counter component 1404, the encoder 1406, and the current DAC 1408 are included in the jittering-sequence generator 902. In another example, a current DAC (e.g., the current DAC 1408) is included in the current source 904 and/or the current source 906. In yet another example, the current-controlled oscillation component 1410 includes the current sources 904 and 906, the switches 908 and 910, the capacitor 916, the amplifier 912, the comparators 914 and 918, the NAND gates 920 and 922, and the buffer 928.

According to one embodiment, the counter component 1404 receives the clock signal 826 and generates a signal 1412 that is encoded by the encoder 1406. As an example, an encoded signal 1414 is received by the DAC 1408 which outputs a current signal 1416 (e.g., $I_{dac2}$) to the current-controlled oscillation component 1410. In another example, the current-controlled oscillation component 1410 also receives a current signal 1402 (e.g., $I_0$) and outputs the clock signal 826 and the ramp signal 824. As shown in FIG. 8(c), the counter component 1404 changes the signal 1412 in response to the clock signal 826 to jitter the oscillation frequency of the clock signal 826 and/or the ramping frequency of the ramp signal 824. For example, the clock signal 826 is associated with one or more switching periods corresponding to the oscillation frequency of the clock signal 826. In another example, the ramp signal 824 is associated with one or more ramping periods corresponding to the ramping frequency of the ramp signal 824. In yet another example, a switching period is equal in duration to a ramping period. In yet another example, a switching period and a ramping period start at a same time and end at a same time. In yet another example, the current signal 1402 is fixed.

According to another embodiment, at the beginning of a first switching period, the counter component 1404 generates the signal 1412 at a first value, and the current DAC 1408 generates the current 1416 at a first magnitude in response to the signal 1412 being at the first value. For example, the oscillation frequency of the clock signal 826 and/or the ramping frequency of the ramp signal 824 is jittered in response to the current 1416 being at the first magnitude. In another example, at the beginning of a second switching period that follows the first switching period, the counter component 1404 generates the signal 1412 at a second value, and the current DAC 1408 generates the current 1416 at a second magnitude in response to the signal 1412 being at the second value. In yet another example, the oscillation frequency of the clock signal 826 and/or the ramping frequency of the ramp signal 824 is jittered again in response to the current 1416 being at the second magnitude.

According to yet another embodiment, the ramping frequency of the ramp signal 824 is determined as follows:

$$f = \frac{\beta}{I_0 + I_{dac2}} \quad \text{(Equation 1)}$$

where β represents a constant, $I_0$ represents the direct-current signal 1402, and $I_{dac2}$ represents the signal 1416.

If $I_{dac2} \ll I_0$, the ramping frequency of the ramp signal 824 is determined as follows, according to certain embodiments:

$$f = \frac{\beta}{I_0}\left(1 - \frac{I_{dac2}}{I_0}\right) \quad \text{(Equation 2)}$$

Based on Equation 2, the ramping frequency of the ramp signal 824 is modulated by the current signal 1416. For example, the charging current 932 and the discharging current 934 satisfy the following equation:

$$I_{charge} = I_{discharge} = I_0 + I_{dac2} \quad \text{(Equation 3)}$$

According to yet another embodiment, if no input signals are received by the amplification system 800, a modulation period associated with the output signal 820 (e.g., PWM) is determined as follows:

$$T_{i,PWM} = \frac{1}{4} \times T_{i-1,RAMP} + \frac{3}{4} \times T_{i,RAMP} \quad \text{(Equation 4)}$$

where $T_{i, PWM}$ represents a current modulation period associated with the output signal 820, $T_{i-1, RAMP}$ represents a previous ramping period, and $T_{i, RAMP}$ represents a current ramping period.

According to yet another embodiment, if the amplification system 800 receives one or more input signals, the duty cycle of the output signal 820 changes, and the modulation period associated with the output signal 820 is determined as follows:

$$T_{i,PWM} = \frac{1}{\alpha} \times T_{i-1,RAMP} + \frac{\alpha - 1}{\alpha} \times T_{i,RAMP} \quad \text{(Equation 5)}$$

where α represents a positive number associated with the input signals. Based on Equation 5, if α changes with the increasing input signals, the duty cycle of the output signal 820 increases, and more frequency values for the output signal 820 appear, according to some embodiments.

Figure 9:
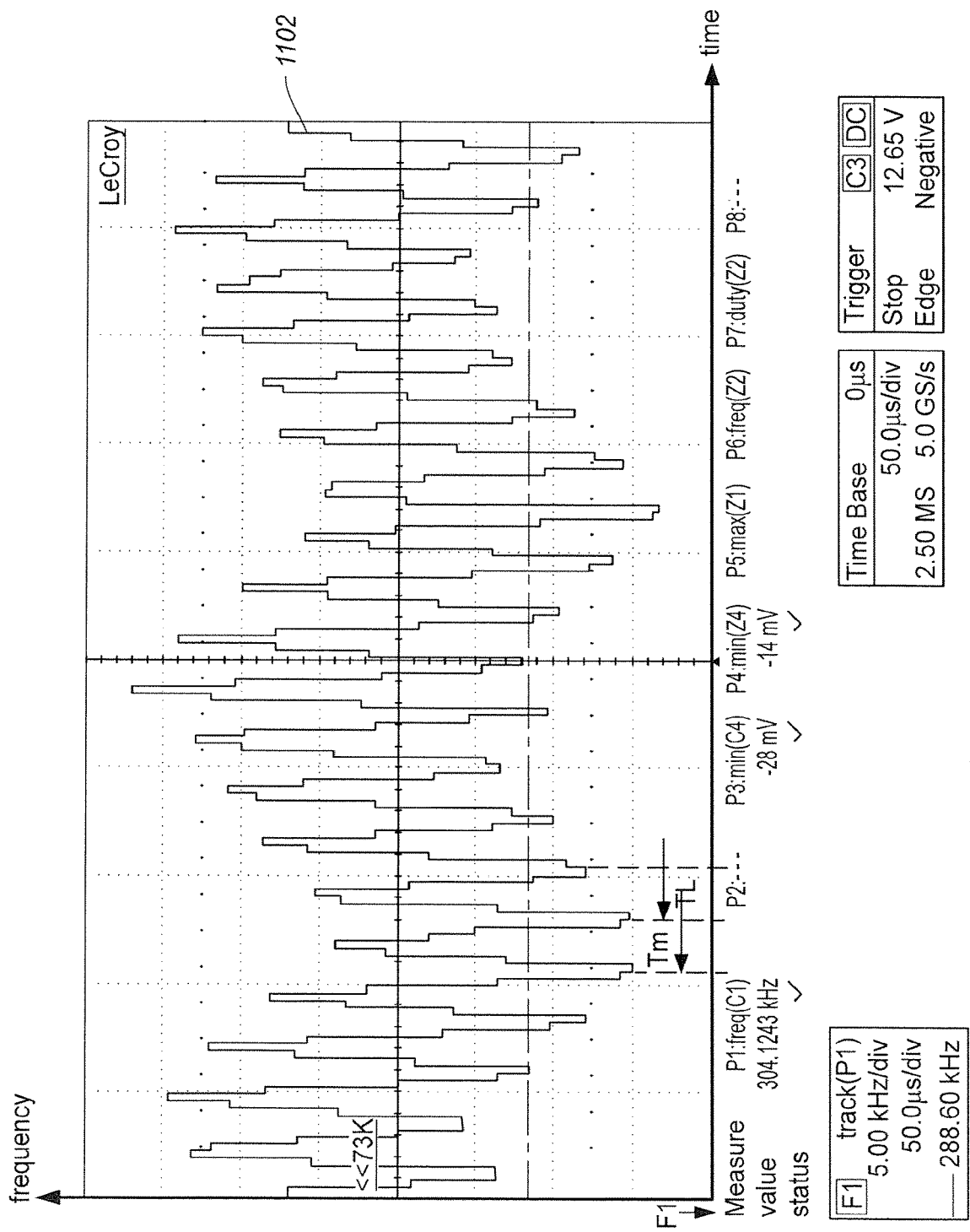
FIG. 9 is a simplified timing diagram for the amplification system as shown in FIG. 6 that includes an oscillator with periodic jittering and receives one or more input signals according to one embodiment of the present invention.

FIG. 9 is a simplified timing diagram for the amplification system 800 that includes the oscillator 808 with periodic jittering and receives the input signal 818 according to one embodiment of the present invention. This diagram is merely an example, which should not unduly limit the scope of the claims. One of ordinary skill in the art would recognize many variations, alternatives, and modifications. The waveform 1102 represents values of a modulation frequency associated with the signal 820 (e.g., PWM) of the amplification system 800 as a function of time. For example, the amplification system 800 includes the oscillator 808 with periodic littering as shown in FIG. 7, FIG. 8(a), FIG. 8(b), and/or FIG. 8(c).

As shown in FIG. 9, there are two littering periods $T_1$ and $T_m$. According to one embodiment, multiple frequency steps appear in each of the littering periods $T_1$ and $T_m$, where each frequency step corresponds to a particular switching frequency value. But the frequency values of the littering period $T_1$ are different from those of the littering period $T_m$, and further, the frequency values appearing in the littering periods $T_1$ and $T_m$ are different from the frequency values in other littering periods, as shown in FIG. 9, in certain embodiments. Compared with FIG. 7, more frequency values appear over time due to the littering of the ramping signal 824 by changing the charging current 932 and the discharging current 934, according to some embodiments.

As discussed above and further emphasized here, FIG. 7, FIG. 8(a), FIG. 8(b), FIG. 8(c) and FIG. 9 are merely examples, which should not unduly limit the scope of the claims. One of ordinary skill in the art would recognize many variations, alternatives, and modifications. In certain embodiments, the littering-sequence generator 902 is external to the oscillator 808. In some embodiments, the counter component 1404, the encoder 1406, and the current DAC 1408 are external to the oscillator 808. For example, FIG. 7 and FIG. 9 show periodic littering, but the periodic littering can be combined with pseudo-random littering, as shown in FIG. 10.

Figure 10:
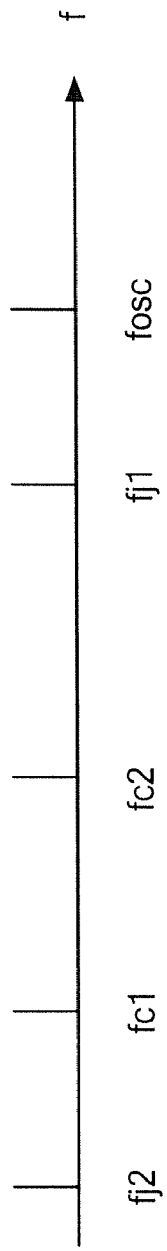
FIG. 10 is a simplified timing diagram showing a combination of periodic jittering and pseudo-random jittering for the oscillator as part of the amplification system as shown in FIG. 6 according to yet another embodiment of the present invention.

FIG. 10 is a simplified frequency spectrum diagram showing a combination of periodic littering and pseudo-random littering for the oscillator 808 as part of the amplification system 800 according to yet another embodiment of the present invention. This diagram is merely an example, which should not unduly limit the scope of the claims. One of ordinary skill in the art would recognize many variations, alternatives, and modifications.

According to one embodiment, an audio frequency range is between a frequency value $f_{c1}$ (e.g., about 20 Hz) and a frequency value $f_{c2}$ (e.g., about 20 kHz), and an oscillation frequency of the clock signal 826 (e.g., $f_{osc}$) is larger in magnitude than the upper limit of the audio frequency range. As an example, a frequency (e.g., $f_{j1}$) associated with the periodic jittering as shown in FIG. 7 and/or FIG. 9 is larger in magnitude than the upper limit of the audio frequency range. In another example, a frequency (e.g., $f_{j2}$) associated with a pseudo-random jittering is smaller in magnitude than a lower limit of the audio frequency range. The frequency components of the audio signals 830 is not affected by the periodic jittering and/or the pseudo-random jittering, according to certain embodiments. According to another embodiment, if the number of frequency values for the periodic jittering is $N_{j1}$ and the number of frequency values for the pseudo-random jittering is $N_{j2}$, the number of frequency values associated with the output signals 820 without any input signals is determined as follows:

$$N_{total} = N_{j1} \times N_{j2} \quad \text{(Equation 6)}$$

where $N_{total}$ represents the number of frequency values associated with the output signals 820. For example, if $N_{j1} = 7$ and $N_{j2} = 16$, $N_{total} = 112$. If the amplification system 800 receives input signals, more frequency values appear, as shown in FIG. 10, according to certain embodiments.

Figure 11:
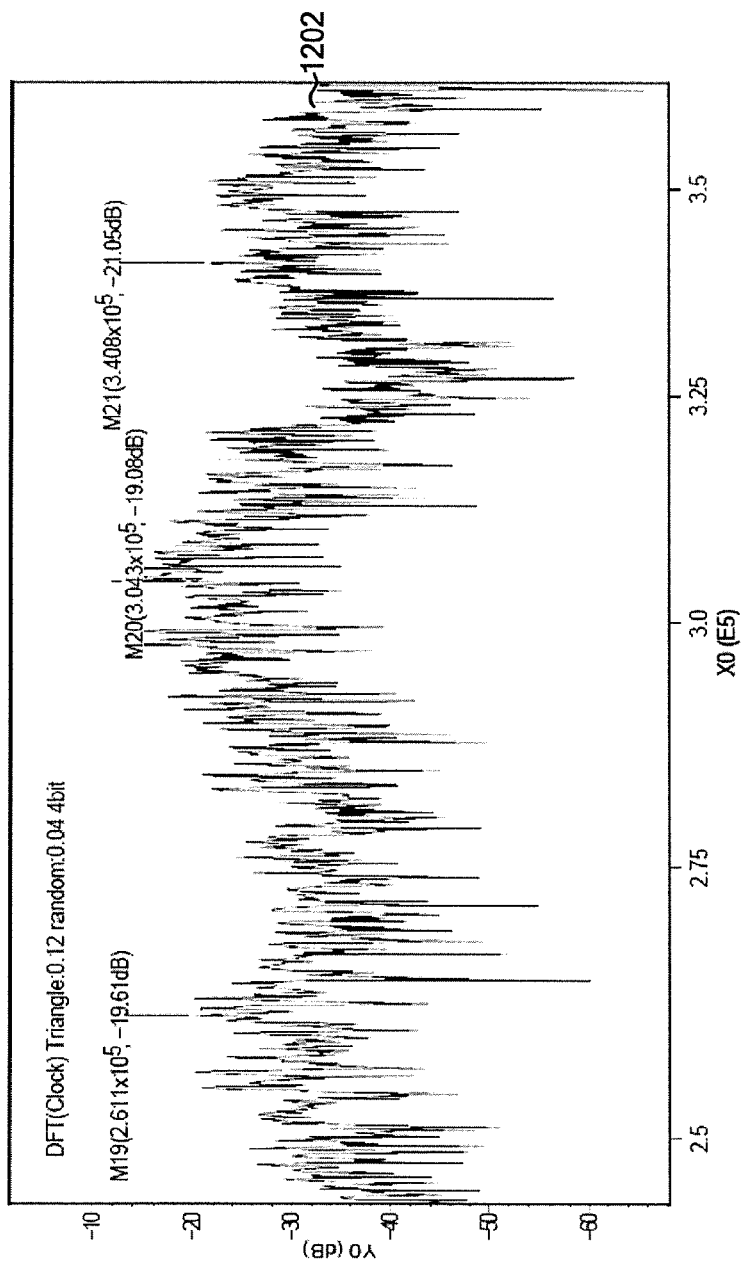
FIG. 11 is a simplified frequency diagram for the amplification system as shown in FIG. 6 that includes an oscillator with a combination of periodic jittering and pseudo-random jittering if the input signal is zero according to one embodiment of the present invention.

FIG. 11 is a simplified frequency spectrum diagram for the amplification system 800 that includes the oscillator 808 with a combination of periodic jittering and pseudo-random jittering if the input signal 818 is zero according to one embodiment of the present invention. This diagram is merely an example, which should not unduly limit the scope of the claims. One of ordinary skill in the art would recognize many variations, alternatives, and modifications. The waveform 1202 represents magnitudes associated with the signal 820 (e.g., PWM) of the amplification system 800 as a function of frequency.

Figure 12A:
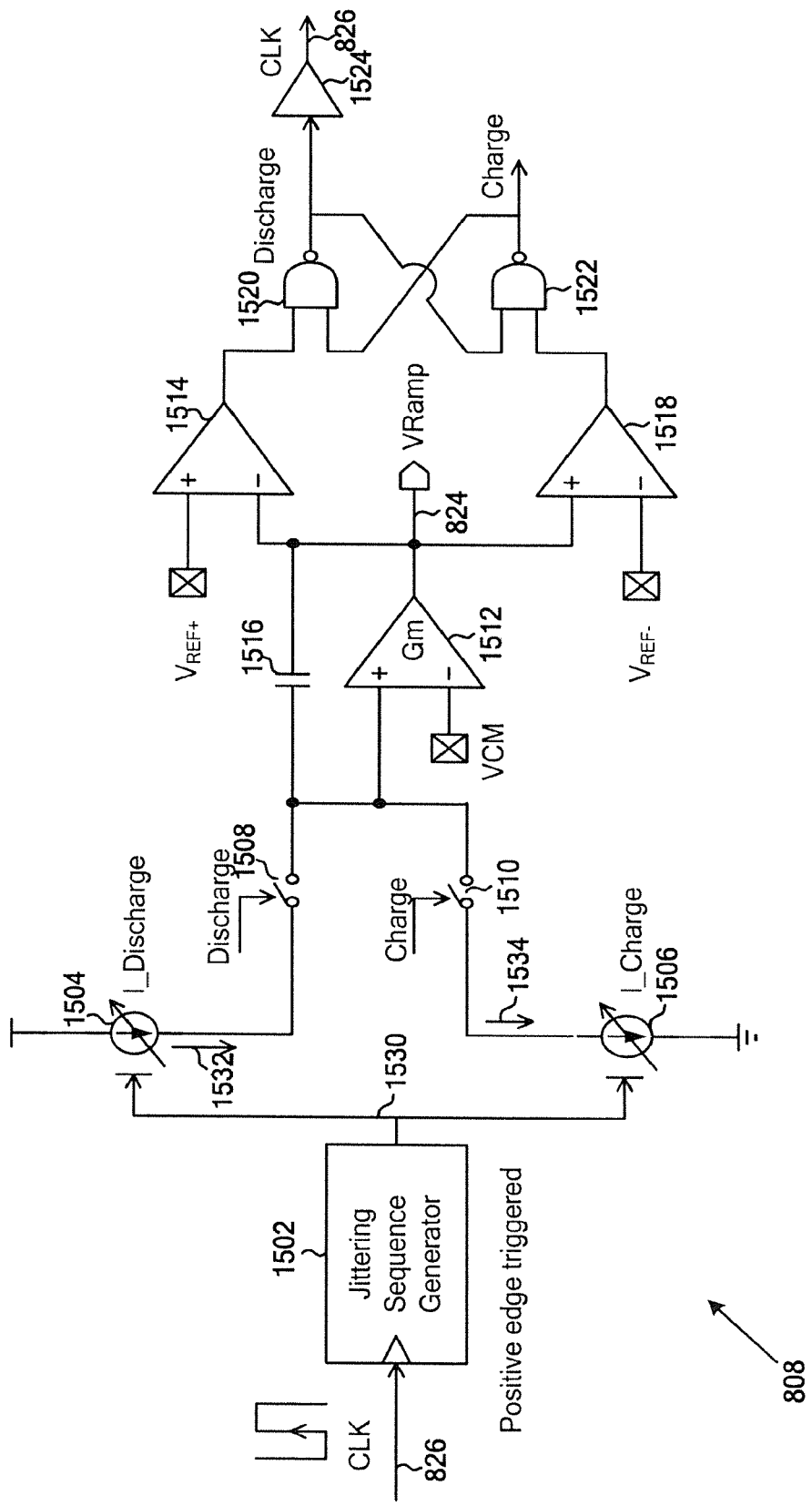
FIG. 12(a) is a simplified diagram showing certain components of the oscillator with a combination of periodic jittering and pseudo-random jittering as part of the amplification system as shown in FIG. 6 according to one embodiment of the present invention.

FIG. 12(a) is a simplified diagram showing certain components of the oscillator 808 with a combination of periodic jittering and pseudo-random jittering as part of the amplification system 800 according to one embodiment of the present invention. This diagram is merely an example, which should not unduly limit the scope of the claims. One of ordinary skill in the art would recognize many variations, alternatives, and modifications. The oscillator 808 includes a jittering-sequence generator 1502, current sources 1504 and 1506, switches 1508 and 1510, a transconductance amplifier 1512, a capacitor 1516, comparators 1514 and 1518, NAND gates 1520 and 1522, and a buffer 1524.

According to one embodiment, the jittering-sequence generator 1502 receives the clock signal 826 and generates a signal 1530 to trigger a change of a charging current 1532 related to the current source 1504 and/or a discharging current 1534 related to the current source 1506 to provide a combination of periodic jittering and pseudo-random jittering to the oscillation frequency of the clock signal 826 and/or the ramping frequency of the ramp signal 824. For example, the switch 1508 is opened or closed in response to a charging signal 1526, and the switch 1510 is opened or closed in response to a discharging signal 1528. In one example, if the charging signal 1526 is at a logical high level, the discharging signal 1528 is at a logic low level, and if the charging signal 1526 is at a logic low level, the discharging signal 1528 is at a logic high level. In another example, the clock signal 826 changes between the logic high level and the logic low level similar to the discharging signal 1528.

Figure 12B:
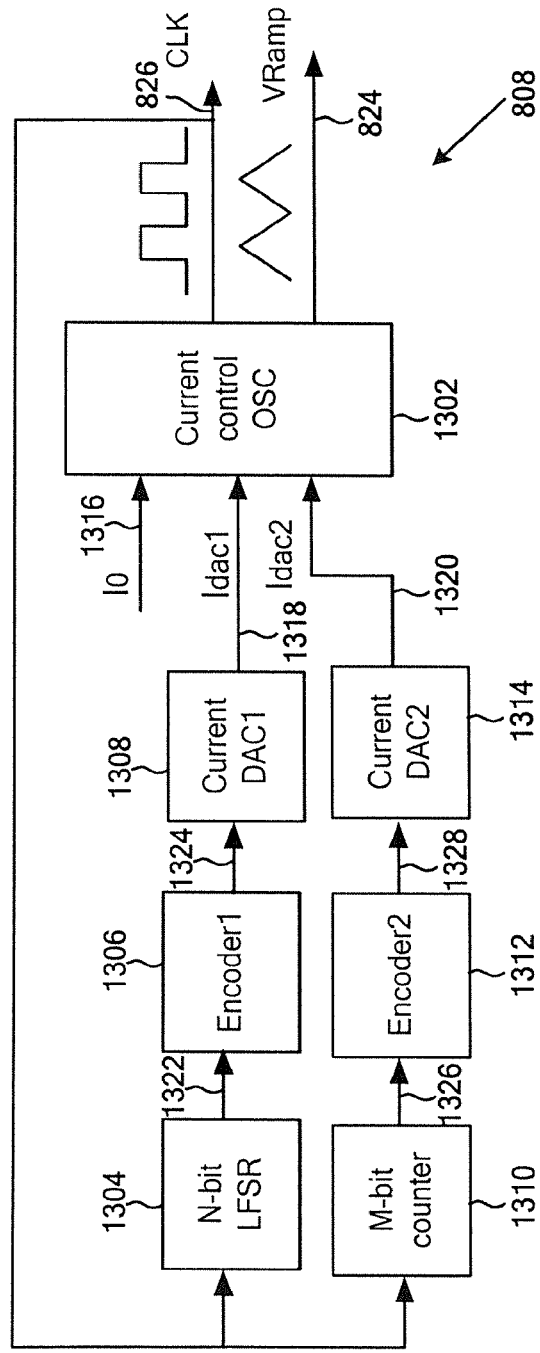
FIG. 12(b) is a simplified diagram showing certain components of the oscillator with a combination of periodic jittering and pseudo-random jittering as part of the amplification system as shown in FIG. 6 according to another embodiment of the present invention.

FIG. 12(b) is a simplified diagram showing certain components of the oscillator 808 with a combination of periodic jittering and pseudo-random jittering as part of the amplification system 800 according to another embodiment of the present invention. This diagram is merely an example, which should not unduly limit the scope of the claims. One of ordinary skill in the art would recognize many variations, alternatives, and modifications. The oscillator 808 includes a current-controlled oscillation component 1302, a linear-feedback-shift-register (LFSR) component 1304, encoder components 1306 and 1312, current digital-analog converters (DACs) 1308 and 1314, and a counter component 1310. For example, the counter component 1310, the encoder component 1312, the current DAC 1314, the LFSR 1304, the encoder component 1306 and the current DAC 1308 are included in the jittering-sequence generator 1502. In another example, a current DAC (e.g., the current DAC 1308 or the current DAC 1314) is included in the current source 1504 and/or the current source 1506. In yet another example, the current-controlled oscillation component 1302 includes the current sources 1504 and 1506, the switches 1508 and 1510, the capacitor 1516, the amplifier 1512, the comparators 1514 and 1518, the NAND gates 1520 and 1522, and the buffer 1528.

According to one embodiment, the LFSR component 1304 that is implemented for pseudo-random jittering receives the clock signal 826 and generates a signal 1322 that is encoded by the encoder component 1306. For example, an encoded signal 1324 is received by the DAC 1308 which outputs a current signal 1318 (e.g., $I_{dac1}$) to the current-controlled oscillation component 1302. In another example, the counter component 1310 that is implemented for periodic jittering receives the clock signal 826 and generates a signal 1326 that is encoded by the encoder 1312. As an example, an encoded signal 1328 is received by the DAC 1314 which outputs a current signal 1320 (e.g., $I_{dac2}$) to the current-controlled oscillation component 1302. In another example, the current-controlled oscillation component 1302 also receives a current signal 1316 (e.g., $I_0$) and outputs the clock signal 826 and the ramp signal 824. In another example, the current signal 1316 is fixed.

According to another embodiment, the ramping frequency of the ramp signal 824 is determined as follows:

$$f = \frac{\beta}{I_0 + I_{dac1} + I_{dac2}} \qquad \text{(Equation 7)}$$

where $\beta$ represents a constant, $I_0$ represents the signal 1316, $I_{dac1}$ represents the signal 1318, and $I_{dac2}$ represents the signal 1320.

If $I_{dac1} + I_{dac2} \ll I_0$, the ramping frequency of the ramp signal 824 is determined as follows, according to certain embodiments:

$$f = \frac{\beta}{I_0}\left(1 - \frac{I_{dac1} + I_{dac2}}{I_0}\right) \qquad \text{(Equation 8)}$$

Based on Equation 8, the ramping frequency of the ramp signal 824 is modulated by the current signals 1318 and 1320. For example, the charging current 932 and the discharging current 934 satisfy the following equation:

$$|I_{charge}| = |I_{discharge}| = I_0 + I_{dac1} + I_{dac2}| \qquad \text{(Equation 9)}$$

As discussed above and further emphasized here, FIG. 12(a) and FIG. 12(b) are merely examples, which should not unduly limit the scope of the claims. One of ordinary skill in the art would recognize many variations, alternatives, and modifications. In certain embodiments, the jittering-sequence generator 1502 is external to the oscillator 808. In some embodiments, the counter component 1504, the encoder 1506, and the current DAC 1508 are external to the oscillator 808.

According to one embodiment, a system for amplifying multiple input signals to generate multiple output signals includes a first channel, a second channel, and a third channel. The first channel is configured to receive one or more first input signals, process information associated with the one or more first input signals and a first ramp signal, and generate one or more first output signals based on at least information associated with the one or more first input signals and the first ramp signal. The second channel is configured to receive one or more second input signals, process information associated with the one or more second input signals and a second ramp signal, and generate one or more second output signals based on at least information associated with the one or more second input signals and the second ramp signal. The third channel is configured to receive one or more third input signals, process information associated with the one or more third input signals and a third ramp signal, and generate one or more third output signals based on at least information associated with the one or more third input signals and the third ramp signal. The first ramp signal corresponds to a first phase. The second ramp signal corresponds to a second phase. The first phase and the second phase are different. For example, the system is implemented according to at least FIG. 3, and/or FIG. 4.

According to another embodiment, a system for amplifying multiple input signals to generate multiple output signals includes a first channel and a second channel. The first channel is configured to receive one or more first input signals, process information associated with the one or more first input signals and a first ramp signal, and generate one or more first output signals based on at least information associated with the one or more first input signals and the first ramp signal. The second channel is configured to receive one or more second input signals, process information associated with the one or more second input signals and a second ramp signal, and generate one or more second output signals based on at least information associated with the one or more second input signals and the second ramp signal. The first ramp signal corresponds to a first phase. The second ramp signal corresponds to a second phase. A difference between the first phase and the second phase is equal to 180 degrees. For example, the system is implemented according to at least FIG. 5(*a*).

According to yet another embodiment, a system for amplifying multiple input signals to generate multiple output signals includes a first channel and a second channel. The first channel includes a first loop filter, a first signal processing component and a first output component, and is configured to receive one or more first input signals, process information associated with the one or more first input signals and a ramp signal, and generate one or more first output signals based on at least information associated with the one or more first input signals and the ramp signal. The second channel includes a second loop filter, a second signal processing component and a second output component, and is configured to receive one or more second input signals, process information associated with the one or more second input signals and the ramp signal, and generate one or more second output signals based on at least information associated with the one or more second input signals and the ramp signal. The first loop filter is configured to process information associated with the one or more first input signals and generate one or more first filtered signals based on at least information associated with the one or more first input signals. The first signal processing component is configured to process information associated with the one or more first filtered signals and generate one or more first processed signals based on at least information associated with the one or more first filtered signals. The first output component is configured to process information associated with the one or more first processed signals and generate the one or more first output signals based on at least information associate with the one or more first processed signals. The second loop filter is configured to process the one or more second input signals and generate one or more second filtered signals based on at least information associated with the one or more second input signals. The second signal processing component is configured to process information associated with the one or more second filtered signals and generate one or more second processed signals based on at least information associated with the one or more second filtered signals. The second output component is configured to process information associated with the one or more second processed signals and generate the one or more second output signals based on at least information associate with the one or more second processed signals. The one or more first processed signals are associated with a first phase. The one or more second processed signals are associated with a second phase. A difference between the first phase and the second phase is equal to 180 degrees. For example, the system is implemented according to at least FIG. 5(*b*).

In one embodiment, a system for amplifying multiple input signals to generate multiple output signals includes a first channel and a second channel. The first channel includes a first loop filter and one or more first comparators, and is configured to receive one or more first input signals, process information associated with the one or more first input signals and a ramp signal, and generate one or more first output signals based on at least information associated with the one or more first input signals and the ramp signal. The second channel includes a second loop filter and one or more second comparators, and is configured to receive one or more second input signals, process information associated with the one or more second input signals and the ramp signal, and generate one or more second output signals based on at least information associated with the one or more second input signals and the ramp signal. The first loop filter is configured to process information associated with the one or more first input signals and generate one or more first filtered signals based on at least information associated with the one or more first input signals. The one or more first comparators include one or more first terminals and one or more second terminals and are configured to receive the one or more first filtered signals at the first terminals and the ramp signal at the second terminals, generate one or more first comparison signals based on at least information associated with the first filtered signals and the ramp signal, and output the one or more first comparison signals in order to generate the one or more first output signals. The second loop filter is configured to process information associated with the one or more second input signals and generate one or more second filtered signals based on at least information associated with the one or more second input signals. The one or more second comparators include one or more third terminals and one or more fourth terminals and are configured to receive the one or more second filtered signals at the third terminals and the ramp signal at the fourth terminals, generate one or more second comparison signals based on at least information associated with the second filtered signals and the ramp signal, and output the one or more second comparison signals in order to generate the one or more second output signals. The one or more second terminals include one or more inverting terminals and the one or more fourth terminals include one or more non-inverting terminals, or the one or more second terminals include one or more non-inverting terminals and the one or more fourth terminals include one or more inverting terminals. For example, the system is implemented according to at least FIG. 5(*c*).

In another embodiment, a system for amplifying one or more input signals to generate one or more output signals includes, an oscillator component configured to generate a ramp signal associated with a ramping frequency, a loop filter component configured to receive one or more input signals and generate one or more filtered signals based on at least information associated with the one or more input signals, and a comparator component configured to receive the one or more filtered signals and the ramp signal and generate one or more comparison signals based on at least information associated with the one or more filtered signals and the ramp signal. The oscillator component is further configured to, change the ramping frequency periodically so that one or more changes in the ramping frequency are made in each jittering period corresponding to a jittering frequency, and output the ramping signal associated with the changed ramping frequency. The uttering frequency is larger than an upper limit of a predetermined audio frequency range. For example, the system is implemented according to at least FIG. 6, FIG. 7, FIG. 8(a), FIG. 8(b), FIG. 8(c), and/or FIG. 9.

In yet another embodiment, a system for amplifying one or more input signals to generate one or more output signals includes, an oscillator component configured to generate a ramp signal associated with a ramping frequency, the ramping frequency corresponding to one or more ramping periods, a loop filter component configured to receive one or more input signals and generate one or more filtered signals based on at least information associated with the one or more input signals, and a comparator component configured to receive the one or more filtered signals and the ramp signal and generate one or more comparison signals based on at least information associated with the one or more filtered signals and the ramp signal. The oscillator component is further configured to, at an end of a first ramping period, change a charging current or a discharging current so that a first duration of the first ramping period differs from a second duration of a second ramping period following the first ramping period. The first duration and the second duration correspond to different magnitudes of the ramping frequency. For example, the system is implemented according to at least FIG. 6, FIG. 7, FIG. 8(a), FIG. 8(b), FIG. 8(c), FIG. 9, FIG. 10, FIG. 11, FIG. 12(a), and/or FIG. 12(b).

According one embodiment, a method for amplifying multiple input signals to generate multiple output signals includes, receiving one or more first input signals, processing information associated with the one or more first input signals and a first ramp signal, and generating one or more first output signals based on at least information associated with the one or more first input signals and the first ramp signal. The method further includes, receiving one or more second input signals, processing information associated with the one or more second input signals and a second ramp signal, and generating one or more second output signals based on at least information associated with the one or more second input signals and the second ramp signal. In addition, the method includes receiving one or more third input signals, processing information associated with the one or more third input signals and a third ramp signal, and generating one or more third output signals based on at least information associated with the one or more third input signals and the third ramp signal. The first ramp signal corresponds to a first phase. The second ramp signal corresponds to a second phase. The first phase and the second phase are different. For example, the method is implemented according to at least FIG. 3, and/or FIG. 4.

According to another embodiment, a method for amplifying multiple input signals to generate multiple output signals includes, receiving one or more first input signals, processing information associated with the one or more first input signals and a first ramp signal, and generating one or more first output signals based on at least information associated with the one or more first input signals and the first ramp signal. The method further includes, receiving one or more second input signals, processing information associated with the one or more second input signals and a second ramp signal, and generating one or more second output signals based on at least information associated with the one or more second input signals and the second ramp signal. The first ramp signal corresponds to a first phase. The second ramp signal corresponds to a second phase. A difference between the first phase and the second phase is equal to 180 degrees. For example, the method is implemented according to at least FIG. 5(a).

According to yet another embodiment, a method for amplifying multiple input signals to generate multiple output signals includes, receiving one or more first input signals by a first channel including a first loop filter, a first signal processing component and a first output component, processing information associated with the one or more first input signals and a ramp signal, and generating one or more first output signals based on at least information associated with the one or more first input signals and the ramp signal. The method further includes, receiving one or more second input signals by a second channel including a second loop filter, a second signal processing component and a second output component, processing information associated with the one or more second input signals and the ramp signal, and generating one or more second output signals based on at least information associated with the one or more second input signals and the ramp signal. The processing information associated with the one or more first input signals and a ramp signal includes, processing information associated with the one or more first input signals by the first loop filter, generating one or more first filtered signals based on at least information associated with the one or more first input signals, processing information associated with the one or more first filtered signals by the first signal processing component, and generating one or more first processed signals based on at least information associated with the one or more first filtered signals. The generating one or more first output signals based on at least information associated with the one or more first input signals and the ramp signal includes, processing information associated with the one or more first processed signals by the first output component, and generating the one or more first output signals based on at least information associate with the one or more first processed signals. The processing information associated with the one or more second input signals and the ramp signal includes, processing information associated with the one or more second input signals by the second loop filter, generating one or more second filtered signals based on at least information associated with the one or more second input signals, processing information associated with the one or more second filtered signals by the second signal processing component, and generating one or more second processed signals based on at least information associated with the one or more second filtered signals. The generating one or more second output signals based on at least information associated with the one or more second input signals and the ramp signal includes, processing information associated with the one or more second processed signals by the second output component, and generating the one or more second output signals based on at least information associate with the one or more second processed signals. The one or more first processed signals are associated with a first phase, the one or more second processed signals are associated with a second phase, and a difference between the first phase and the second phase is equal to 180 degrees. For example, the method is implemented according to at least FIG. 5(b).

In one embodiment, a method for amplifying multiple input signals to generate multiple output signals includes, receiving one or more first input signals by a first channel including a first loop filter and one or more first comparators, processing information associated with the one or more first input signals and a ramp signal, and generating one or more first output signals based on at least information associated with the one or more first input signals and the ramp signal. The method further includes, receiving one or more second input signals by a second channel including a second loop filter and one or more second comparators, processing information associated with the one or more second input signals and the ramp signal, and generating one or more second output signals based on at least information associated with the one or more second input signals and the ramp signal. The processing information associated with the one or more first input signals and a ramp signal includes, processing information associated with the one or more first input signals at the first loop filter, and generating one or more first filtered signals based on at least information associated with the one or more first input signals. The generating one or more first output signals based on at least information associated with the one or more first input signals and the ramp signal includes, receiving the one or more first filtered signals by one or more first terminals of the one or more first comparators, receiving the ramp signal by one or more second terminals of the one or more first comparators, generating one or more first comparison signals based on at least information associated with the first filtered signals and the ramp signal, outputting the one or more first comparison signals, and generating the one or more first output signals based on at least information associated with the one or more first comparison signals. The processing information associated with the one or more second input signals and the ramp signal includes, processing information associated with the one or more second input signals by the second loop filter, and generating one or more second filtered signals based on at least information associated with the one or more second input signals. The generating one or more second output signals based on at least information associated with the one or more second input signals and the ramp signal includes, receiving the one or more second filtered signals by one or more third terminals of the one or more second comparators, receiving the ramp signal by one or more fourth terminals of the one or more second comparators, generating one or more second comparison signals based on at least information associated with the second filtered signals and the ramp signal, outputting the one or more second comparison signals, and generating the one or more second output signals based on at least information associated with the one or more second comparison signals. The one or more second terminals include one or more inverting terminals and the one or more fourth terminals include one or more non-inverting terminals, or the one or more second terminals include one or more non-inverting terminals and the one or more fourth terminals include one or more inverting terminals. For example, the method is implemented according to at least FIG. 5(c).

In another embodiment, a method for amplifying one or more input signals to generate one or more output signals includes, generating a ramp signal associated with a ramping frequency, receiving one or more input signals, and processing information associated with the one or more input signals. The method further includes, generating one or more filtered signals based on at least information associated with the one or more input signals, receiving the one or more filtered signals and the ramp signal, processing information associated with the one or more filtered signals and the ramp signal, and generating one or more comparison signals based on at least information associated with the one or more filtered signals and the ramp signal. The generating a ramp signal associated with a ramping frequency includes, changing the ramping frequency periodically so that one or more changes in the ramping frequency are made in each jittering period corresponding to a jittering frequency, and outputting the ramping signal associated with the changed ramping frequency. The jittering frequency is larger than an upper limit of a predetermined audio frequency range. For example, the method is implemented according to at least FIG. 6, FIG. 7, FIG. 8(a), FIG. 8(b), FIG. 8(c), and/or FIG. 9.

In yet another embodiment, a method for amplifying one or more input signals to generate one or more output signals includes, generating a ramp signal associated with a ramping frequency, the ramping frequency corresponding to one or more ramping periods, receiving one or more input signals, and processing information associated with the one or more input signals. The method further includes, generating one or more filtered signals based on at least information associated with the one or more input signals, receiving the one or more filtered signals and the ramp signal, and generating one or more comparison signals based on at least information associated with the one or more filtered signals and the ramp signal. The generating a ramp signal associated with a ramping frequency includes changing a charging current or a discharging current at an end of a first ramping period so that a first duration of the first ramping period differs from a second duration of a second ramping period following the first ramping period. The first duration and the second duration correspond to different magnitudes of the ramping frequency. For example, the method is implemented according to at least FIG. 6, FIG. 7, FIG. 8(a), FIG. 8(b), FIG. 8(c), FIG. 9, FIG. 10, FIG. 11, FIG. 12(a), and/or FIG. 12(b).

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for amplifying multiple input signals to generate multiple output signals, the system comprising:
   a first channel configured to receive multiple first input signals and generate multiple first output signals based at least in part on the multiple first input signals and a first ramp signal; and
   a second channel configured to receive multiple second input signals and generate multiple second output signals based at least in part on the multiple second input signals and a second ramp signal;
   wherein:
      the first ramp signal corresponds to a first phase;
      the second ramp signal corresponds to a second phase; and
      the first phase and the second phase are different.

2. A method for amplifying multiple input signals to generate multiple output signals, the method comprising:
- receiving multiple first input signals;
- receiving a first ramp signal;
- generating multiple first output signals based at least in part on the multiple first input signals and the first ramp signal;
- receiving multiple second input signals;
- receiving a second ramp signal; and
- generating multiple second output signals based at least in part on the multiple second input signals and the second ramp signal;
- wherein:
  - the first ramp signal corresponds to a first phase;
  - the second ramp signal corresponds to a second phase; and
  - the first phase and the second phase are different.

* * * * *